US008928343B2

(12) United States Patent
Sellathamby et al.

(10) Patent No.: US 8,928,343 B2
(45) Date of Patent: Jan. 6, 2015

(54) TESTING OF ELECTRONIC CIRCUITS USING AN ACTIVE PROBE INTEGRATED CIRCUIT

(75) Inventors: Christopher V. Sellathamby, Edmonton (CA); Steven Slupsky, Edmonton (CA); Brian Moore, Edmonton (CA)

(73) Assignee: Scanimetrics Inc., Edmonton, Alberta (CA)

( * ) Notice: Subject to any disclaimer, the term of this patent is extended or adjusted under 35 U.S.C. 154(b) by 1054 days.

(21) Appl. No.: 12/594,758

(22) PCT Filed: Apr. 3, 2008

(86) PCT No.: PCT/CA2008/000609
§ 371 (c)(1),
(2), (4) Date: Oct. 5, 2009

(87) PCT Pub. No.: WO2008/119179
PCT Pub. Date: Oct. 9, 2008

(65) Prior Publication Data
US 2010/0164519 A1 Jul. 1, 2010

Related U.S. Application Data

(60) Provisional application No. 60/921,681, filed on Apr. 3, 2007, provisional application No. 60/941,384, filed on Jun. 1, 2007.

(51) Int. Cl.
*G01R 31/20* (2006.01)
*G01R 1/073* (2006.01)
*G01R 31/302* (2006.01)
*G01R 31/3185* (2006.01)
*G01R 31/319* (2006.01)

(52) U.S. Cl.
CPC ........ *G01R 1/07385* (2013.01); *G01R 31/3025* (2013.01); *G01R 31/318505* (2013.01); *G01R 31/31905* (2013.01); *G01R 1/07342* (2013.01)
USPC .................................................... 324/754.01

(58) Field of Classification Search
CPC ........... G01R 31/2889; G01R 1/07385; G01R 31/31905; G01R 31/31926; G01R 1/36; G01R 31/2853
USPC ................. 324/754.01–754.3, 762.01–762.1, 324/755.01–755.11
See application file for complete search history.

(56) References Cited

U.S. PATENT DOCUMENTS 5,323,107 A * 6/1994 D'Souza .................... 324/750.3
5,642,054 A    6/1997 Pasiecznik, Jr.
(Continued)

OTHER PUBLICATIONS

Harame et al., IBM Journal of Research and Development, vol. 47, No. 2/3, Mar./May 2003, pp. 139-175 (To Follow).
(Continued)

*Primary Examiner* — Tung X Nguyen
(74) *Attorney, Agent, or Firm* — Davis & Bujold, PLLC; Michael J. Bujold

(57) ABSTRACT

A method and apparatus are provided for transmission/reception of signals between automatic test equipment (ATE) and a device under test (DUT). A probe card has a plurality of associated proximate active probe integrated circuits (APIC) connected to a plurality of probes. Each APIC interfaces with one or more test interface points on the DUT through probes. Each APIC receives and processes signals communicated between the ATE and the DUT. Low information content signals transmitted from the ATE are processed into high information content signals for transmission to the probe immediately adjacent the APIC, and high information content or time critical signals received by the APIC from the DUT are transmitted as low information content signals to the ATE. Because the APIC is immediately adjacent the probe there is minimum loss or distortion of the information in the signal from the DUT.

21 Claims, 43 Drawing Sheets

(56) References Cited

U.S. PATENT DOCUMENTS

| | | |
|---|---|---|
| 5,764,655 A | 6/1998 | Kirihata et al. |
| 6,161,205 A | 12/2000 | Tuttle |
| 6,331,782 B1 | 12/2001 | White et al. |
| 6,412,086 B1 | 6/2002 | Friedman et al. |
| 6,449,308 B1 | 9/2002 | Knight, Jr. et al. |
| 6,525,566 B2 | 2/2003 | Haigh et al. |
| 6,573,801 B1 | 6/2003 | Benham et al. |
| 6,625,682 B1 | 9/2003 | Simon et al. |
| 6,727,723 B2 * | 4/2004 | Shimizu et al. .......... 324/750.05 |
| 6,747,469 B2 | 6/2004 | Rutten |
| 6,759,863 B2 | 7/2004 | Moore |
| 6,768,195 B2 | 7/2004 | Drost |
| 6,825,052 B2 | 11/2004 | Eldridge et al. |
| 6,853,206 B2 * | 2/2005 | Hubner et al. ........... 324/754.07 |
| 6,882,239 B2 | 4/2005 | Miller |
| 6,885,202 B2 | 4/2005 | Slupsky |
| 7,057,518 B2 | 6/2006 | Schmidt |
| 7,109,730 B2 | 9/2006 | Slupsky |
| 7,196,531 B2 | 3/2007 | Grube et al. |
| 7,245,134 B2 * | 7/2007 | Granicher et al. ....... 324/754.07 |
| 2003/0085726 A1 | 5/2003 | Rutten |
| 2003/0115517 A1 | 6/2003 | Rutten |
| 2004/0059971 A1 | 3/2004 | Cowan |
| 2005/0027073 A1 | 2/2005 | Lo et al. |
| 2006/0170435 A1 | 8/2006 | Granicher et al. |
| 2006/0273809 A1 | 12/2006 | Miller |
| 2007/0013401 A1 | 1/2007 | Khandros |

OTHER PUBLICATIONS

Harame et al. "Design automation methodology and rf/analog modelling for rf CMOS an SiGe BiCMOS technologies." IBM Jounral of Research and Development, vol. 47, No. 2/3 dated Mar./May 2003, pp. 139-175.

* cited by examiner

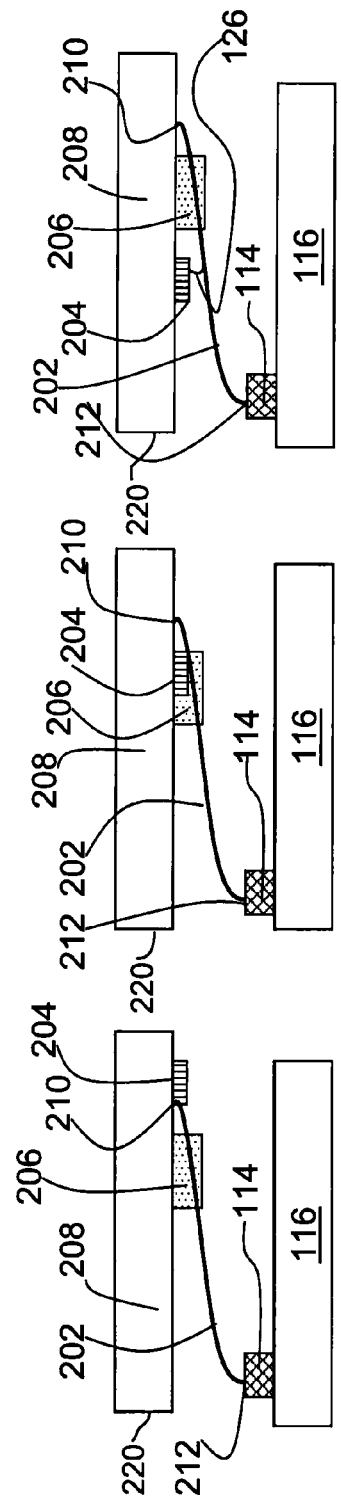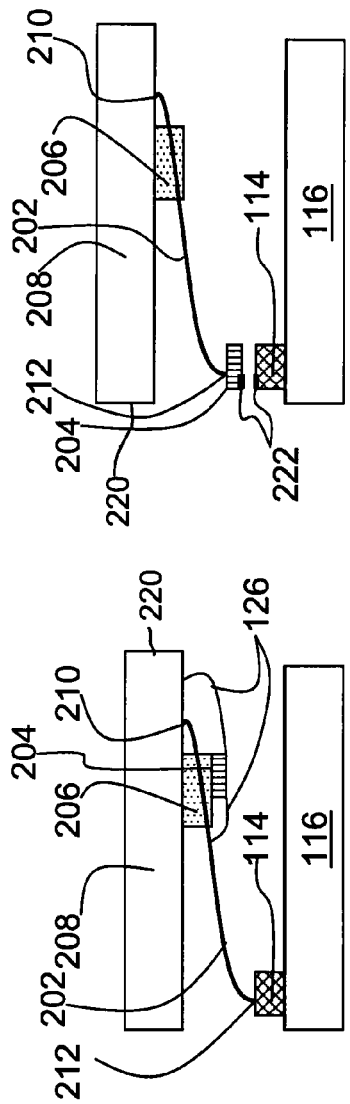

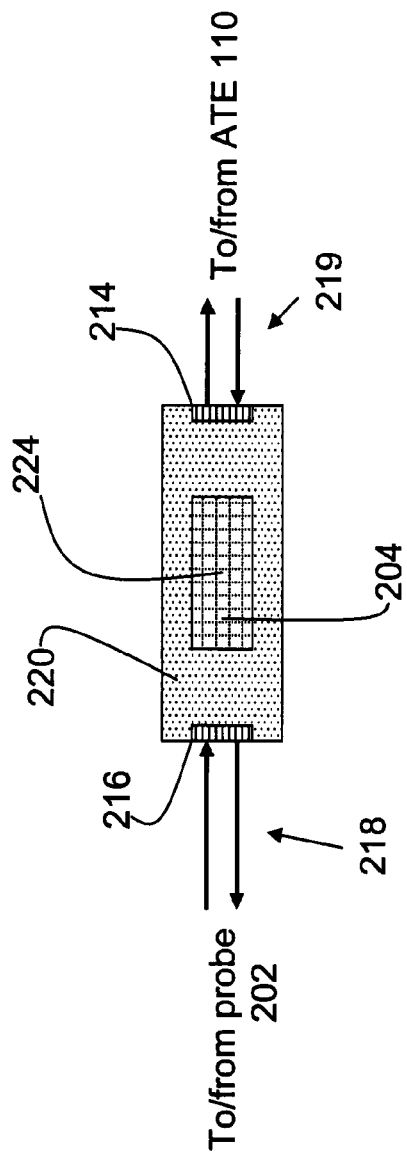
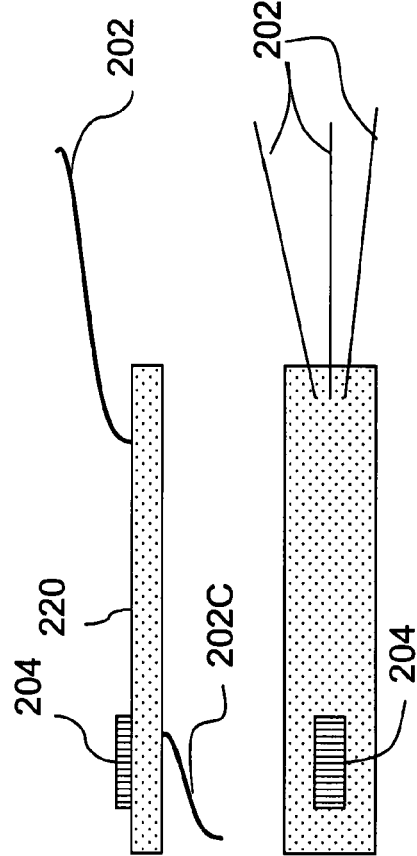
Figure 6a
Figure 6b
Figure 6c

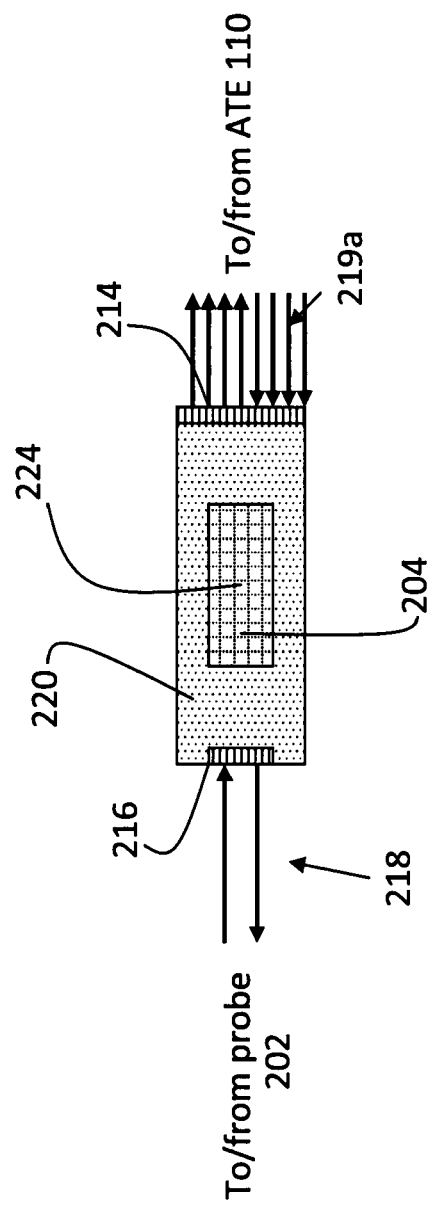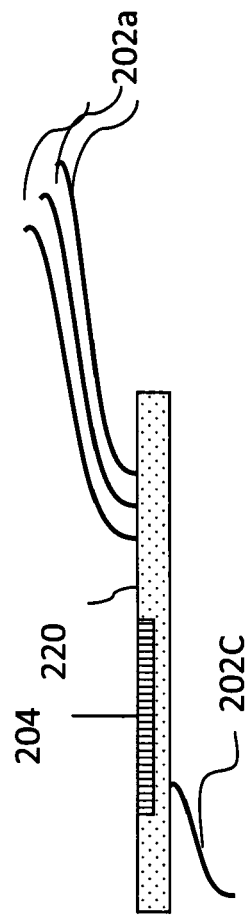
Figure 6f
Figure 6g

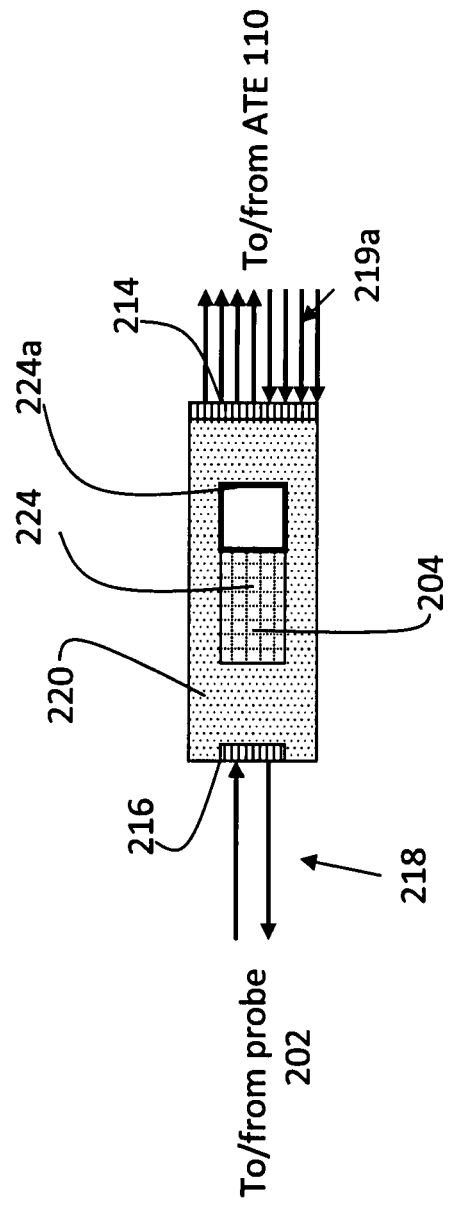
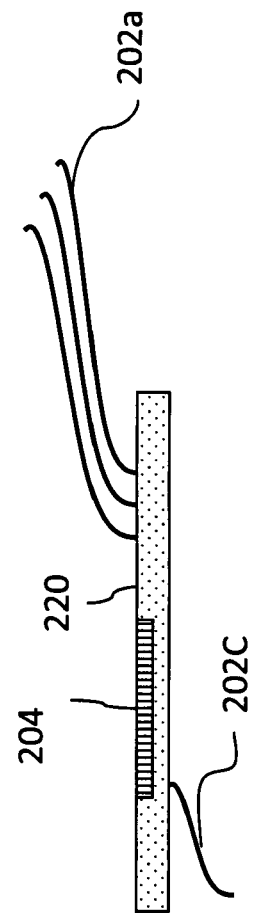
Figure 6h
Figure 6i

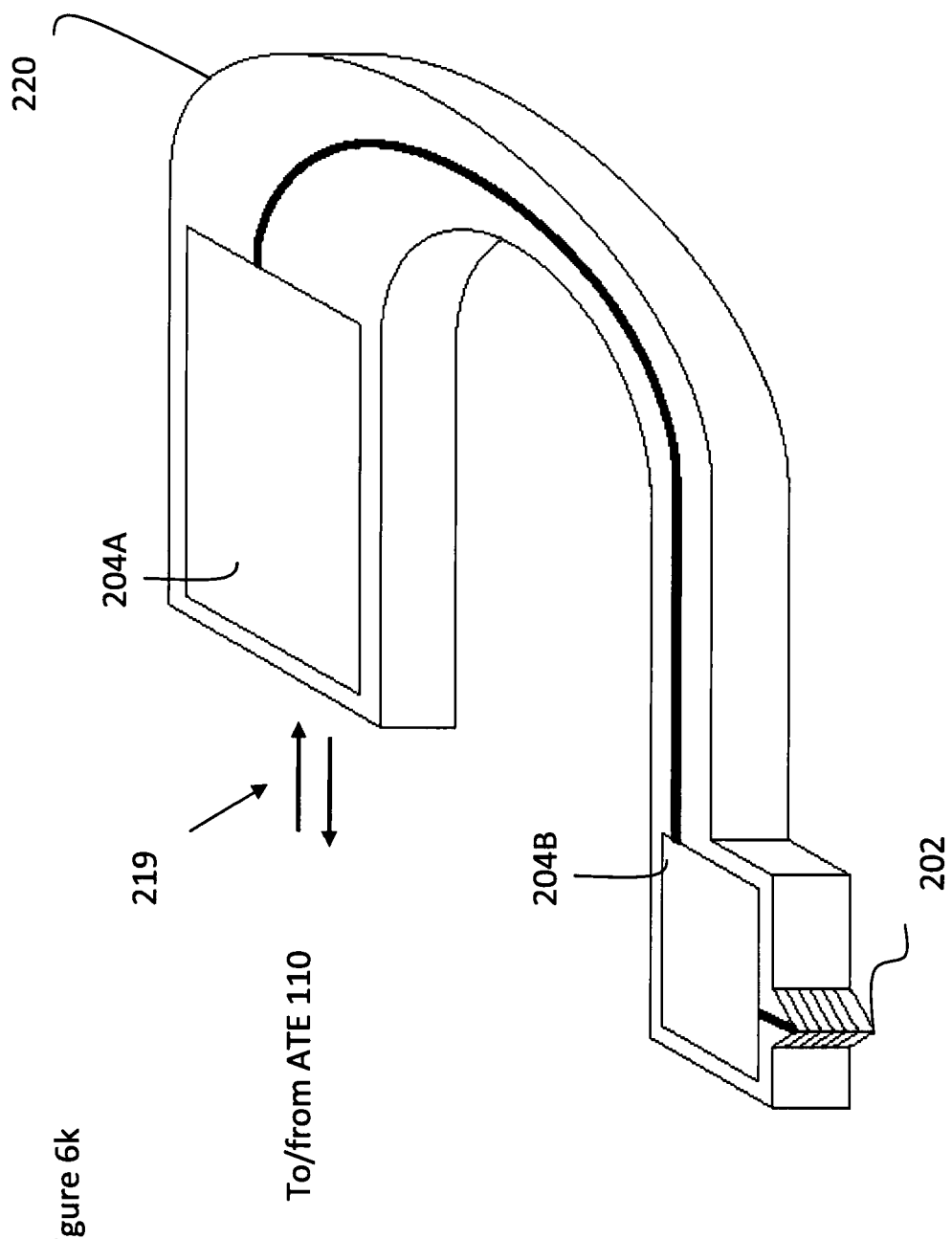

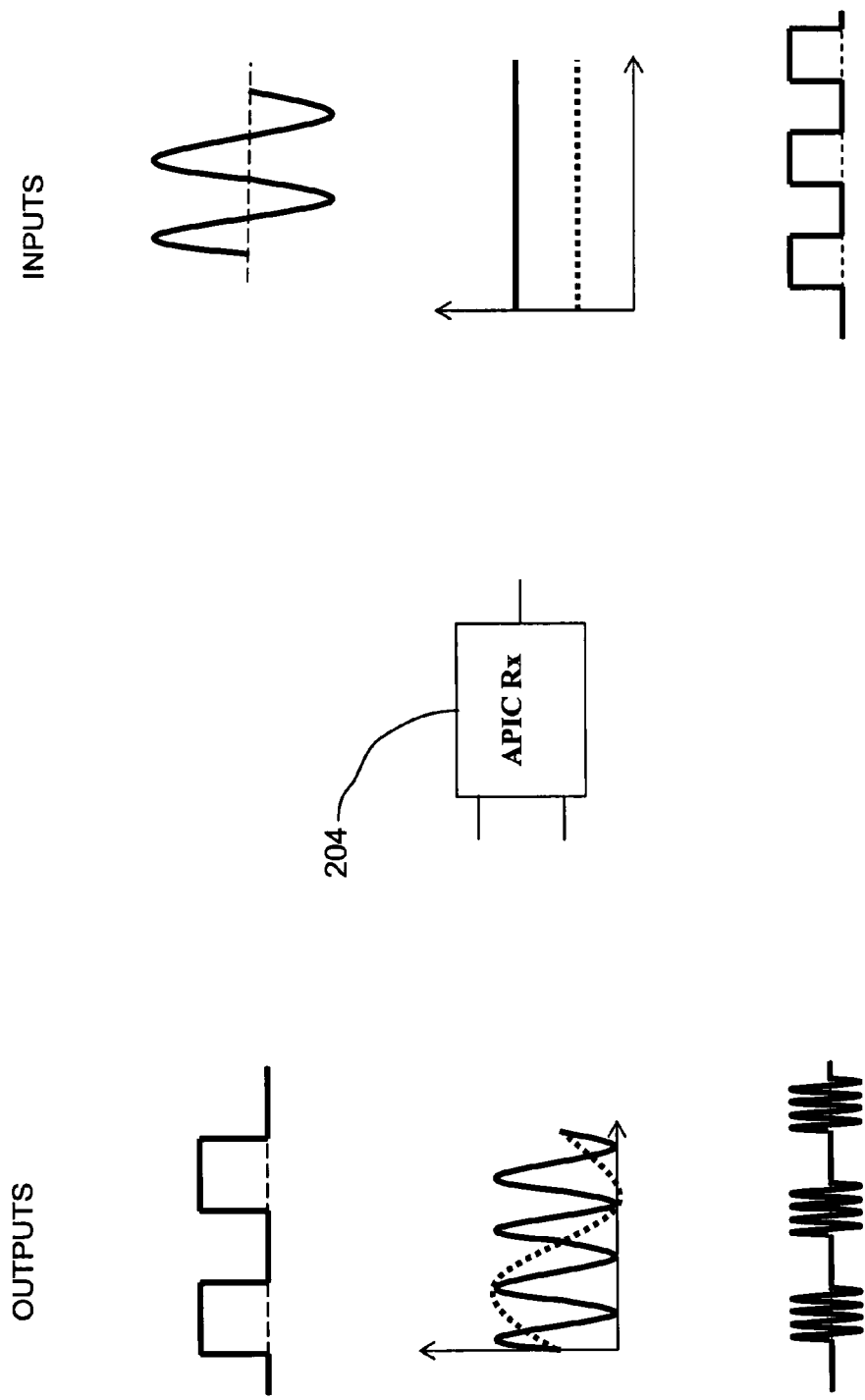

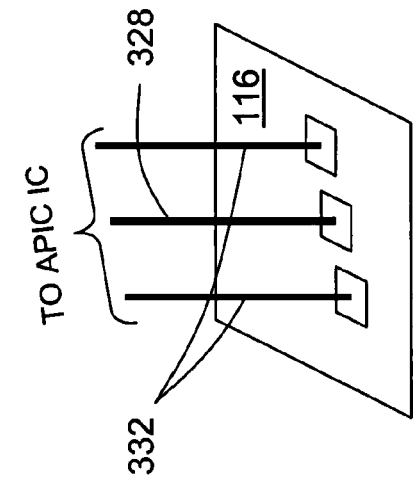
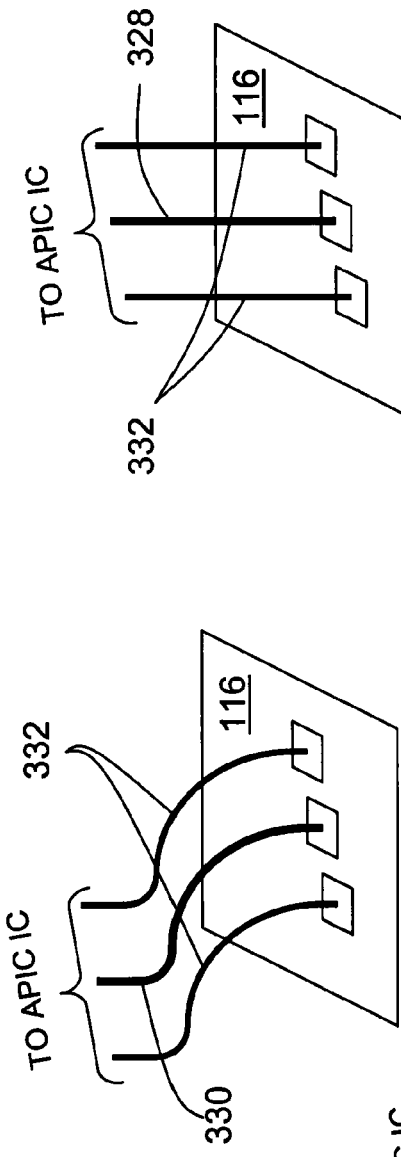
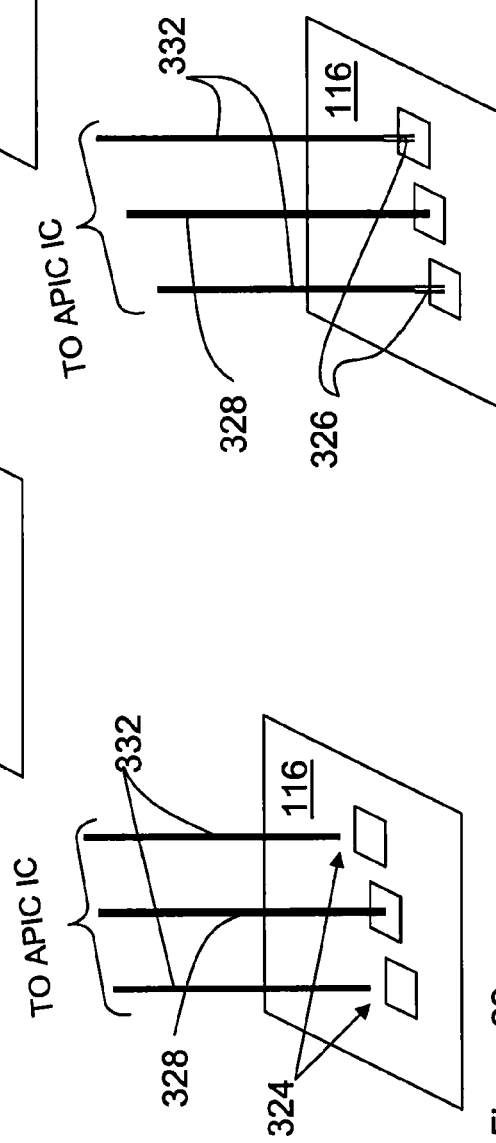

TESTING OF ELECTRONIC CIRCUITS USING AN ACTIVE PROBE INTEGRATED CIRCUIT

FIELD

Apparatus and methods for testing of electronic circuits using an active probe integrated circuit.

BACKGROUND

As Integrated Circuit ("IC") devices are becoming more complex, the cost of testing has escalated to a level where it is creating concern in the industry both in terms of technology limitations and the cost of testing. As a result, there is a continual effort to reduce the total cost of test devices. These initiatives are further fuelled by the continuing drive to reduce the cost of components. Hence elimination of any wastage overheads from testing and packaging has gained significant attention in recent years, and will continue to play a major role. Industry and market data shows that the operation and maintenance of test equipment contributes a major portion to the overall test cost.

Current solutions in place and proposed each have technological limitations. Integrated Circuits are tested (i.e.: Device Under Test ["DUT"]) typically one at a time by transmitting test data between the test controller and the test head. Multiple touchdowns are performed to test a complete wafer. Due to the distance a signal traverses, there is degradation of signals along with potential noise interference. Multiple channel solutions for testing multiple devices in parallel are costly to implement and possess further reliability issues due to poor signal integrity or potential cross-talk interference. As a consequence of these higher test costs and reliability issues, solutions for parallel test are limited in parallelism (number of sites). Further, adoption has generally been limited to niche markets such as memory test.

The nature of high speed and mixed signal measurements has meant that cost effective wafer test of high speed devices has been difficult to obtain. One of the most effective ways of reducing wafer test costs is higher test parallelism. Note that these issues are true whether measuring wafers, ICs, packaged devices, or even Strips or aggregations of packaged devices. However, prior art devices either are not capable of a high level of parallelism or can do so only at great expense.

Signal integrity issues, costly high speed instrumentation and complex probe card architectures all work against high parallel high speed wafer testing. Today high speed devices are typically tested in either single site or possibly ×2 parallelism. Alternately, some manufacturers opt to perform only DC or low frequency measurements at wafer level for their high speed devices, causing unacceptably high package yield loss. High speed testing includes RF or Memory or serial wired testing.

A growing industry trend has seen the procurement lead times for advanced probe cards that facilitate multi-site testing increase dramatically. This presents a major problem for industry since these lead times can add significant time in the design to manufacture cycle of an integrated circuit design and thus become a significant factor in the time to market for a new chip design.

Prior art probe cards typically have a rigid architecture in which each probe is positioned so as to contact a specific site on a device under test (DUT). The probes may be coupled to an integrated circuit (IC) so that signals between automated test equipment (ATE) and the DUT via the probes are conditioned or otherwise processed for transmission, as described by Rutten in U.S. Pat. No. 6,747,469. The limitation of this technique is that the solution is not cost effective because different designs of DUT chips require a different design of the pre-conditioning IC ("PCIC") leading to unacceptably high non-recurring engineering ("NRE") costs.

The PCIC described by Rutten must be customized by final fabrication steps in the IC process. This customization is the final metal interconnects layers of an IC fabrication, which requires a large investment in design, tooling, capital and know-how. This also fixes the utility of the PCIC and restricts its use to specific DUT designs and specific DUT applications.

In addition, the contact points in Rutten must be customized to physically match both the DUT pads as well as the PCIC. This 'mirror' image contact concept places a burden on the economics of implementation as it requires specific and detailed a-priori knowledge of the DUT before the PCIC is contemplated or constructed leading to unacceptably long lead times to procure a probe card due to the need to procure a custom integrated circuit.

Finally, the Rutten embodiments are susceptible to unacceptably high failure rates of the PCIC due to electronic failure of the PCIC as a result of die cracks and other stress induced failure modes due to mechanical stresses of probes placed over active areas of the PCIC.

The United States Patent 20050237073 A1 describes a method of testing a DUT using a programmable FPGA circuit board that is located on a probe card. This apparatus employs a circuit board and IC's on the probe card to distribute signals. No processing is done to analyse high-speed signals and convert to low-speed for eliminating high frequency resource requirements on the tester.

Harame et al. in IBM Journal of Research and Development, Vol. 47, No. 2/3 dated March/May 2003, pages 139-175, describe the need for integrity in complex RF and mixed-signal communications in "Design automation methodology and RF/analog modeling for RF CMOS and SiGe BiCMOS technologies." They show that the rapidly expanding market for electronic components has led to demand for more rapid testing without incurring high costs, with high reliability and minimum distortion of test signals and responses. These circuits are for implementation on a PCB positioned on a load board used for testing packaged components, not on semi-conductor devices for testing devices in wafer form and therefore signal transmission and degradation issues through PCB still exist.

SUMMARY

According to one embodiment, there is provided a probe card, comprising at least one reprogrammable active probe integrated circuit (APIC) capable of being coupled to one or more of a variety of probe arrays, such that the one or more probe array is selected to suit a device under test (DUT) and the APIC is programmed to suit the one probe array and the DUT.

According to another embodiment, there is provided a probe for testing a device under test (DUT), comprising a probe body having an active probe integrated circuit (APIC) incorporated into the probe body.

According to another embodiment, there is provided a method of forming a probe card, comprising the steps of: providing a programmable active probe integrated circuit (APIC); providing a configurable probe array in communication with the at least one APIC; characterizing a device under test (DUT); reprogramming the at least one APIC based on the characterization of the DUT; and reconfiguring the probe array based on the characterization of the DUT.

According to another embodiment, Active Probe Integrated Circuits (APIC) devices are placed proximate to the probe points to translate control signals from an Automated Test Equipment tester ("ATE") to signals as required to stimulate one or more DUT's so as to reduce or eliminate signal degradation or losses, and to translate response signals from one or more DUT's to control signals sent to an ATE. APIC devices can be used along with different probing technologies, such as cantilever, vertical, MEMs and non-contact probes. The other advantage of using APIC devices is that it be used to supply high-frequency signals to a DUT. The majority of high-speed and high-frequency processing is performed by the APIC to facilitate the use of slow speed and less costly test equipment. Further improvements in performance and high frequency signal integrity can be realized using an APIC device in combination with an enhanced probe needle configuration such as a Ground-Signal combination, Ground-Signal-Ground combination or Ground-Signal-Signal-Ground combination. Other embodiments include (but are not limited to): 1) forming the probe needle and APIC into a single monolithic circuit; 2) direct attachment of an APIC to a probe needle; 3) embedding an APIC into the probe needle.

BRIEF DESCRIPTION OF DRAWINGS

These and other features will become more apparent from the following description in which reference is made to the appended drawings, the drawings are for the purpose of illustration only and are not intended to be in any way limiting, wherein:

FIG. 5a through 5g are diagrams of examples of architectures for the mutual positioning of the probe and IC for contacting the DUT.

FIG. 6a is a schematic diagram of a chip having inlet/outlet ports and an IC used for translating control signals to and from advanced testing equipment and stimulus and response signals to and from a DUT.

FIG. 6b is a side view of the chip shown in FIG. 6a.

FIG. 6c is a top view of the chip shown in FIG. 6a.

FIG. 6f is a diagram of an APIC chip that provides serialization and de-serialization functions close to the circuit under test.

FIG. 6g is a side view of the chip shown in FIG. 6f.

FIG. 6h is a diagram of an APIC chip that provides memory testing functions as well as serialization and de-serialization functions close to the circuit under test.

FIG. 6k is a perspective view of a monolithic APIC and probe with divisional signal processing.

FIG. 6l is a perspective view of a monolithic APIC and probe.

FIG. 22a is a perspective view a probe configurations using a cobra probe with two grounds.

FIG. 22b is a perspective view a probe configurations using a vertical probe with grounded guards.

FIG. 22c is a perspective view a probe configurations using a vertical probe and two ground guards isolation with air gap (exaggerated) between grounds and touch pads.

FIG. 22d is a perspective view a probe configurations using a vertical probe and two ground guard isolation with dielectric between grounds and touch pads.

DETAILED DESCRIPTION

The discussion below relates to a new probe card architecture for testing electronic devices, and in particular integrated circuits (IC). This concept is referred to as "active probes."

The principles of both the apparatus and the method are applicable for probing and thereby testing of several types of IC, including but not limited to those for applications such as RF, serializer/deserializer (SerDes), memory, logic, parametric, digital signal processing, and analog circuitry and digital devices. The process and apparatus discussed herein is illustrated using as an example a probe card having an active probe for RF wafer testing, using RF as high frequency signals. It will be recognized by those of ordinary skill in the art that the principles apply to several other applications, such as to test, for example, high-speed digital circuits, networking circuits, microprocessors, high-frequency circuits, high precision analog, storage devices, and mixed signal circuits.

Using RF as an illustrative example of its application, the signal integrity issues, costly RF instrumentation and complex probe card architectures that all work against high parallel RF wafer test capability using prior art probe cards are overcome, thus providing greatly reduced RF wafer test costs. This solution allows quality measurements of important RF parameters such as frequency, power levels and noise figure at wafer level with high parallelism. In addition to RF applications, it will be recognized that the teachings discussed herein may also be used in relation to other signalling and IC technologies.

There will first be given a discussion of the prior art with reference to FIGS. 1a, 1b and 2. Illustrative embodiments of the apparatus will then be described with reference to FIG. 3 through 15.

Figure 1A:
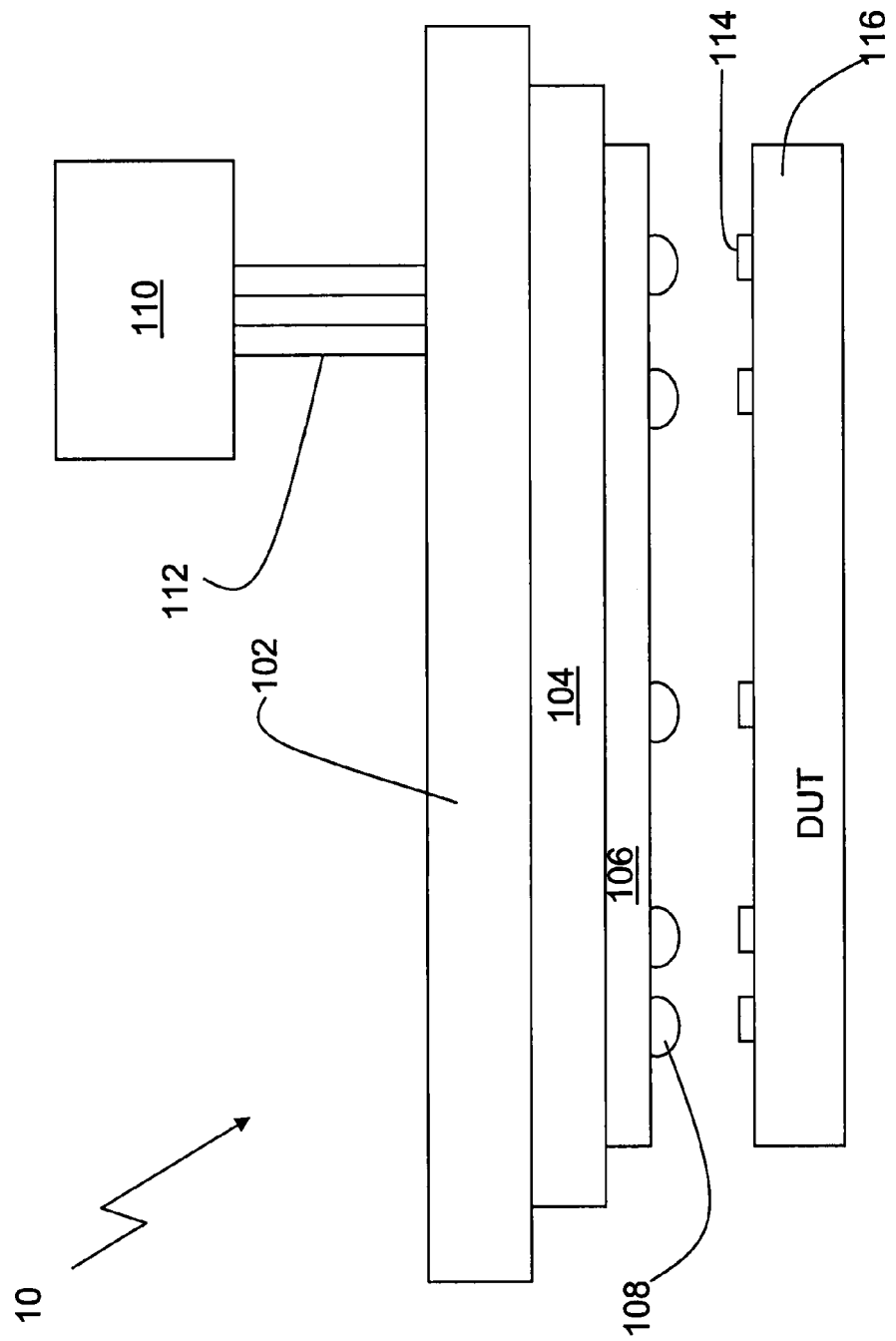
FIG. 1a, labelled PRIOR ART, is schematic diagram in profile of a probe head positioned above a DUT in preparation for testing through contacting.

FIG. 1a illustrates one type of advanced test system having a probe card 10 comprising a test head 102 that has a PCB substrate 104, an IC 106 and a plurality of contact points 108 in communication with an integrated circuit (IC) 106. Signals are received by substrate 104 from a test controller such as automatic test equipment (ATE) 110 as illustrated via lead lines 112 which may include digital, high frequency, high precision analog, RF and power paths. Substrate 104 and IC 106 similarly are in electrical communication. Contact points 108 may be selected from resilient electrically conducting contact means. Contact points 108 are positioned in an array that is a mirror image of an array of contact points 114 on a DUT 116 so that, as probe card 10 is brought into contact with DUT 116 each of contact points 108 contacts the corresponding contact points 114, thus establishing electrical communication between probe card 10 and DUT 116.

Prior art methods and apparatus, including that illustrated in FIG. 1a, have limitations imposed by the system architecture. Prior art probe card 10 has contact points 108 in a specific array to mirror the corresponding contact points 114 of a specific design of DUT 116. Thus prior art probe card 10 is limited to testing only one layout of DUT 116. Significant routing of signals is required on the probe board for transmission via the IC, as illustrated in FIG. 2, leading to signal distortions requiring further treatment of the signals. Tests necessarily are conducted sequentially or with a low degree of parallelism.

Figure 1B:
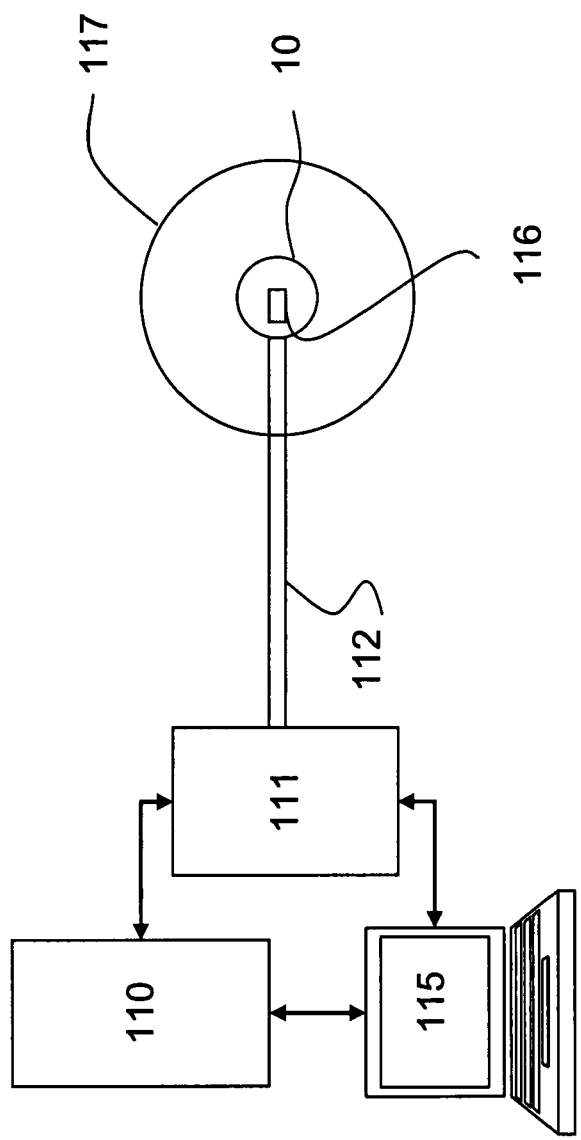
FIG. 1b, labelled PRIOR ART, is schematic diagram of conventional test system.

FIG. 1b shows a complete system that includes ATE 110, computer unit (115) for controlling the ATE 110 and test control unit (111). The test controls signals and test data is delivered to and from the ATE 110 and DUT 117 through the lead lines and the probe card. The DUT 117 is located on a controllable wafer stand (117).

Figure 2:
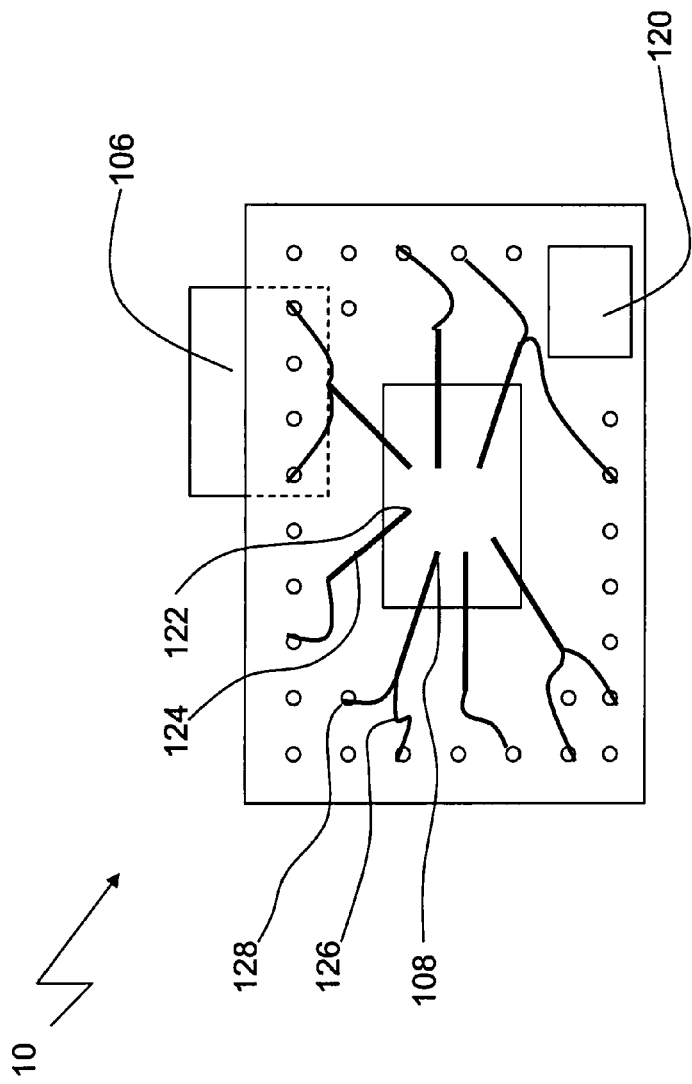
FIG. 2, labelled PRIOR ART, is a bottom view of a probe head having several probes for contacting corresponding contact points on a DUT.

Referring to FIG. 2, probe card 10 has RF electronics circuitry 120 and a plurality of contact points 108 that are situated at distal ends 122 of cantilever probes 124. Electrical signals are communicated to and from probes 124 along wiring 126 and vias 128 to one or more IC 106 on probe card 10.

An illustrative example of the type of device illustrated by FIGS. 1 and 2 is described by Rutten in U.S. Pat. No. 6,747,469. Rutten describes a test system comprising a probe card 10 in which contact points 108 are electrically connected to a preconditioning integrated circuit 106. The geometry or physical layout of probe card 10 and IC 106 and the configuration of IC 106 each are designed specifically for testing one type and geometry or physical layout of DUT 116. Thus, when a different DUT 116 is to be tested, a different IC 106 must be used where such IC 106 may require redesign of the configuration or geometry or both to correspond to the specific architecture of the selected DUT 116. Thus the non-recurring engineering costs ("NRE") associated with the design of IC 106 are amortised over a limited number of tests.

Thus there is a cost advantage that accrues from use of an apparatus and method for testing DUT 116 for which the costs for development of the components can be amortised over tests of several different types of DUT 116.

Figure 3A:
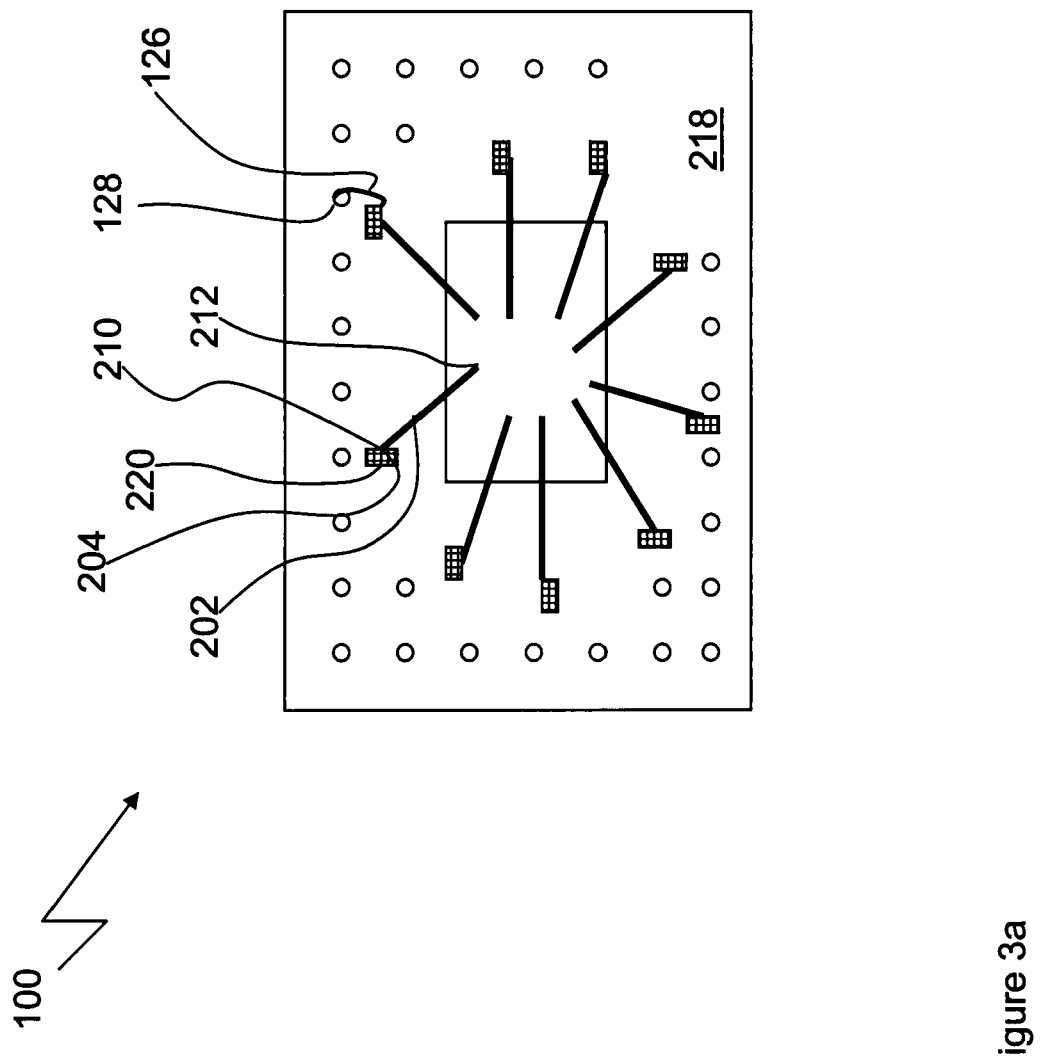
FIG. 3a is a schematic diagram of a probe head using, for illustrative purposes, cantilever probes.

Referring to FIG. 3a, a probe card 100 for testing DUT 116 has a plurality of probes 202 and a plurality of active probe integrated circuits (APIC) 204. There may be multiple probes for each APIC 204 or multiple APICs 204 for each probe 202 or a one to one relationship. Each probe 202 is immediately adjacent to corresponding APIC 204 so as to minimize signal wire lengths extending between them. Thus there is minimum distortion of signals between APIC 204 and corresponding probe 202 and therefore minimum distortion of the signal transmitted to or from DUT 116. Each APIC 204 may be designed so as to provide for conducting a specific test on DUT 116, or may be designed to conduct one or more tests from among several tests.

FIG. 3a illustrates use of cantilever probes 202 and substrate 220. It will be recognized that other types of probes may be used such as solder balls, microsprings, and other electrically conducting resilient contacts as well as non-contact probes. Further, it will be recognized APIC 204 may be mounted directly to the probe card 100 without substrate (or "interposer") 220. APIC 204 as illustrated are at proximate end 210 of each probe 202. It will be recognized that APIC 204 may be located at different sites relative to probe 202, as illustrated in FIG. 5 and described below. APIC 204 may be in communication by electrical communication between substrate 220 and substrate 218. Alternatively, substrate 220 may be in electrical communication using vias 128 with components (not shown) situated at an opposite face of substrate 218.

Probes 202 may be reconfigured by repositioning them. Additionally, they may be reconfigured by actuating the probes electromechanically or by bending them.

Figure 3B:
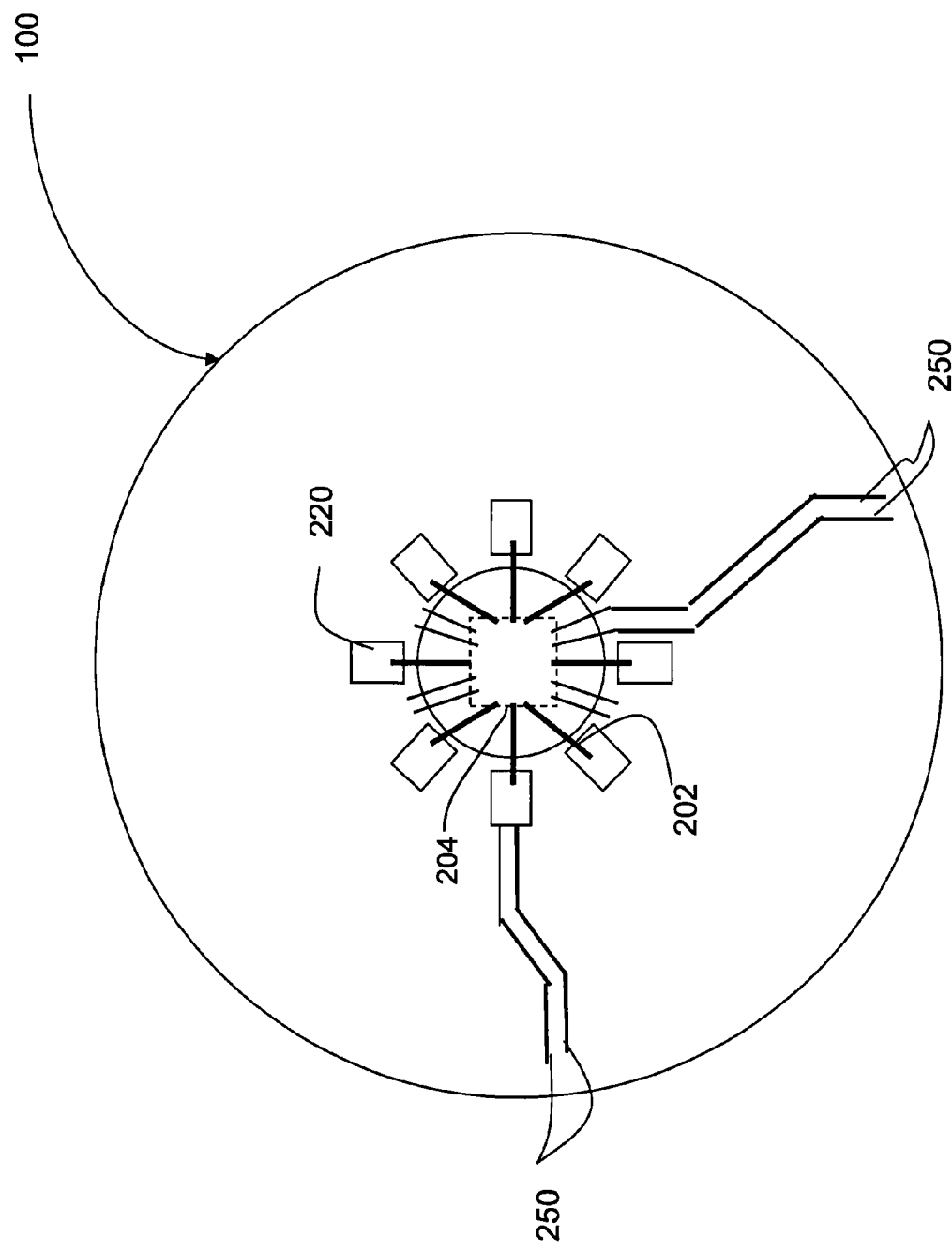
FIG. 3b is a diagram of a single DUT probe card.

FIG. 3b illustrates another embodiment wherein probe card 100 has a plurality of probes 202 and APICs 204 to test one DUT 116.

Figure 3C:
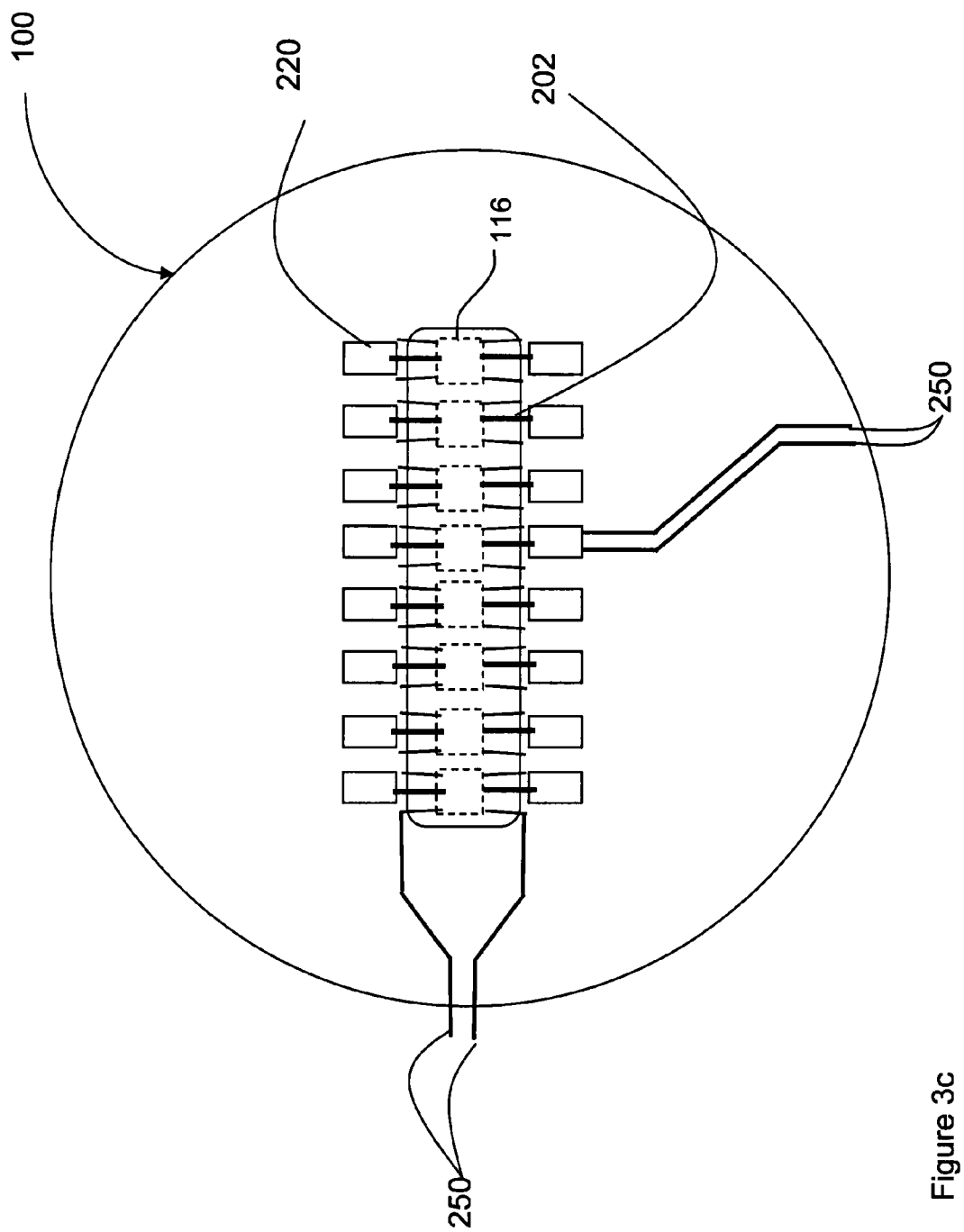
FIG. 3c is a diagram of a multi DUT probe card.

FIG. 3c illustrates another embodiment wherein probe card 100 has a plurality of APICs 204 and probes 202 to test more than one DUT 116.

Figure 3E:
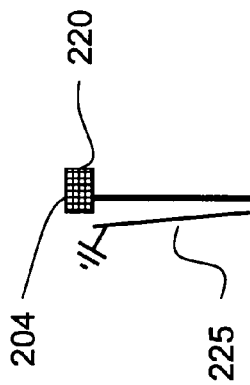
FIG. 3e through 3g are diagrams showing APICs with alternate companion ground lines.
Figure 3F:
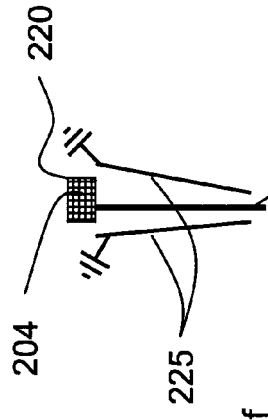
Figure 3G:
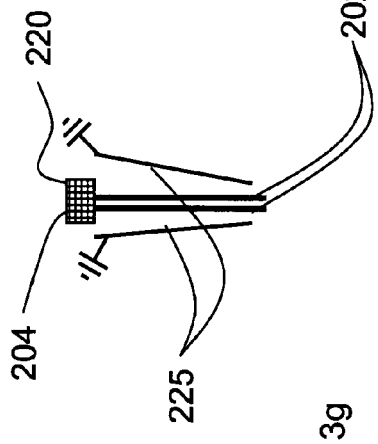
Figure 3D:
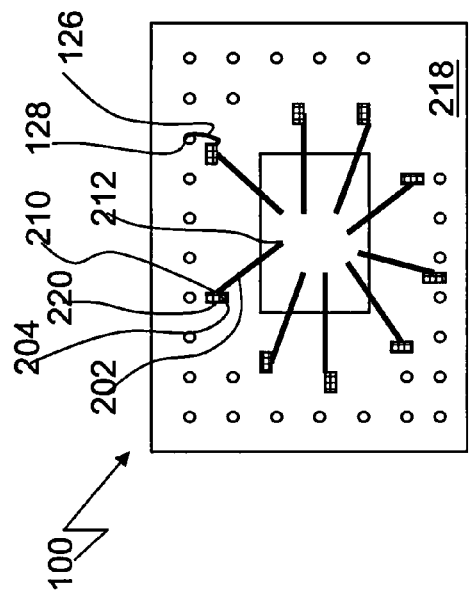
FIG. 3d is a diagram showing multiple APIC testing a single DUT.
Figure 4A:
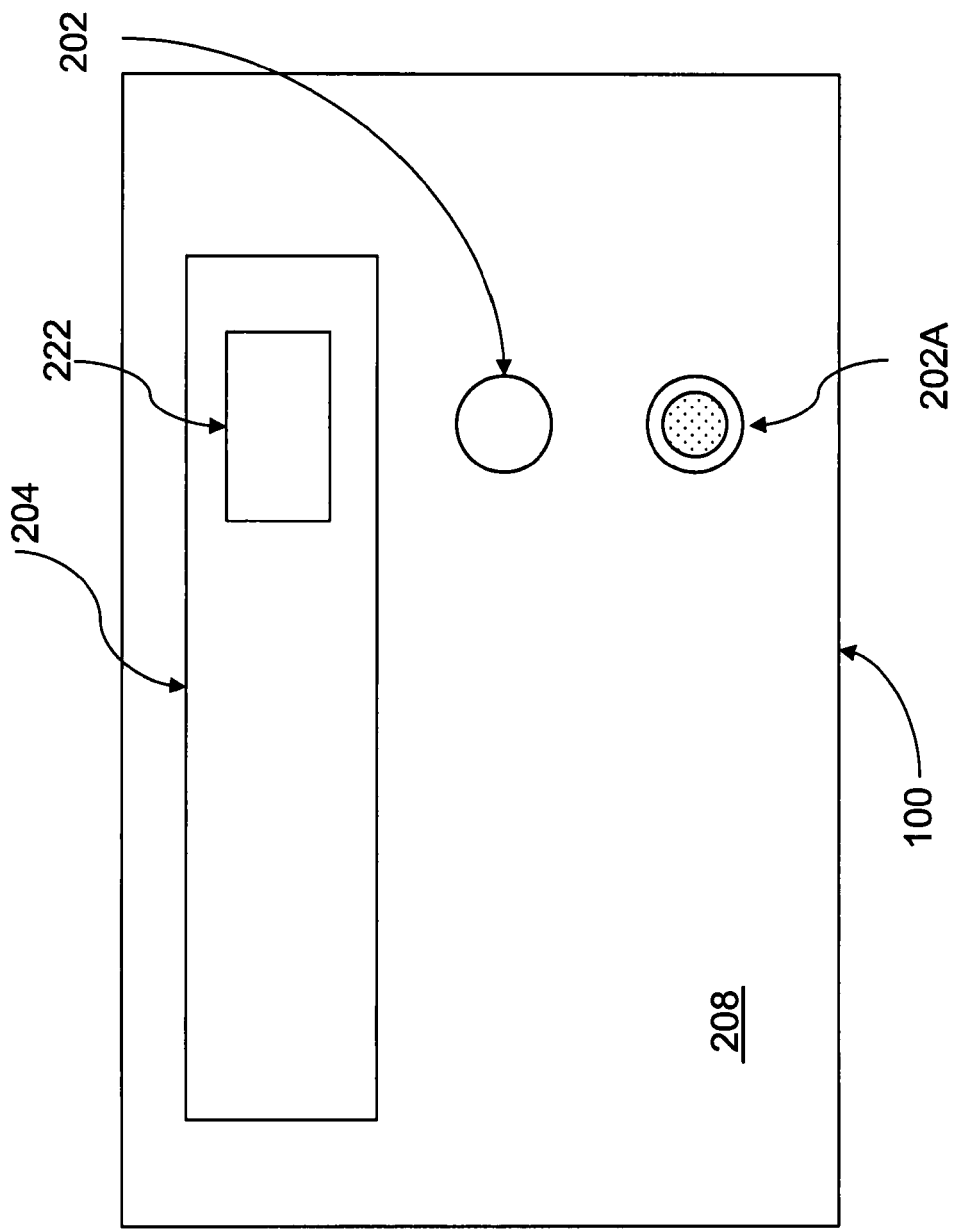
FIG. 4a is a block diagram of a first embodiment of a probe card.
Figure 4B:
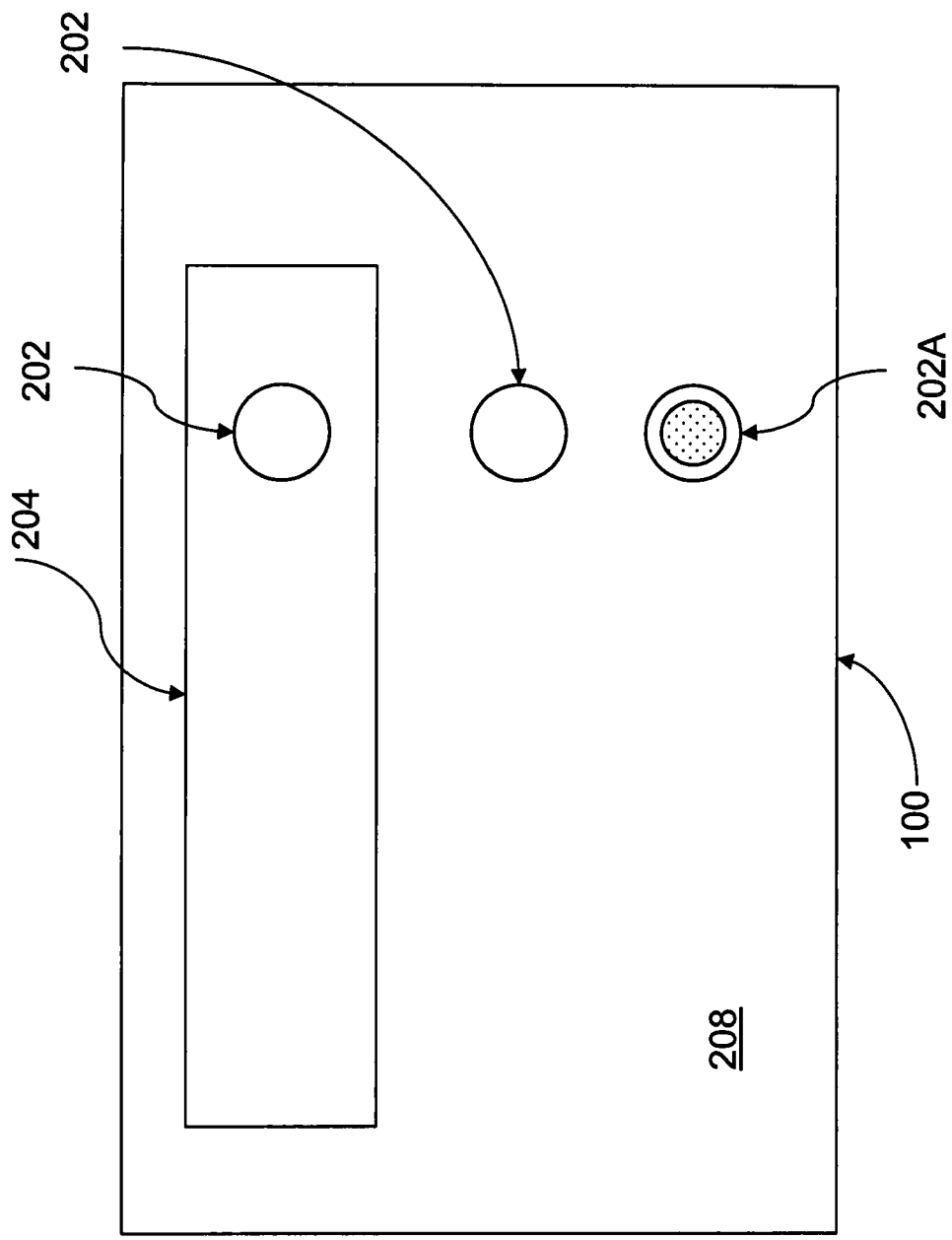
FIG. 4b is a block diagram of a second embodiment of a probe card.
Figure 4C:
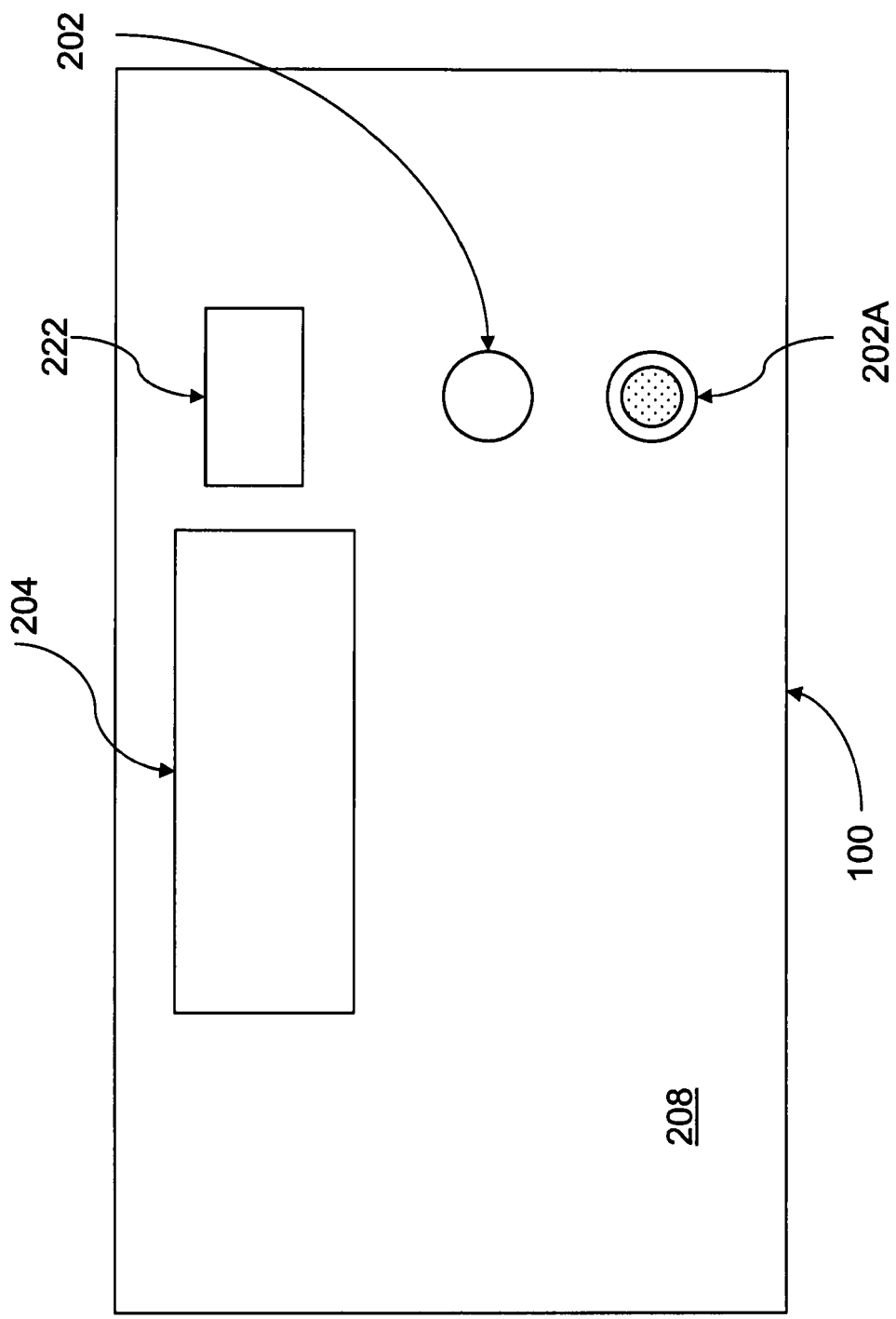
FIG. 4c is a block diagram of a third embodiment of a probe card.
Figure 4D:
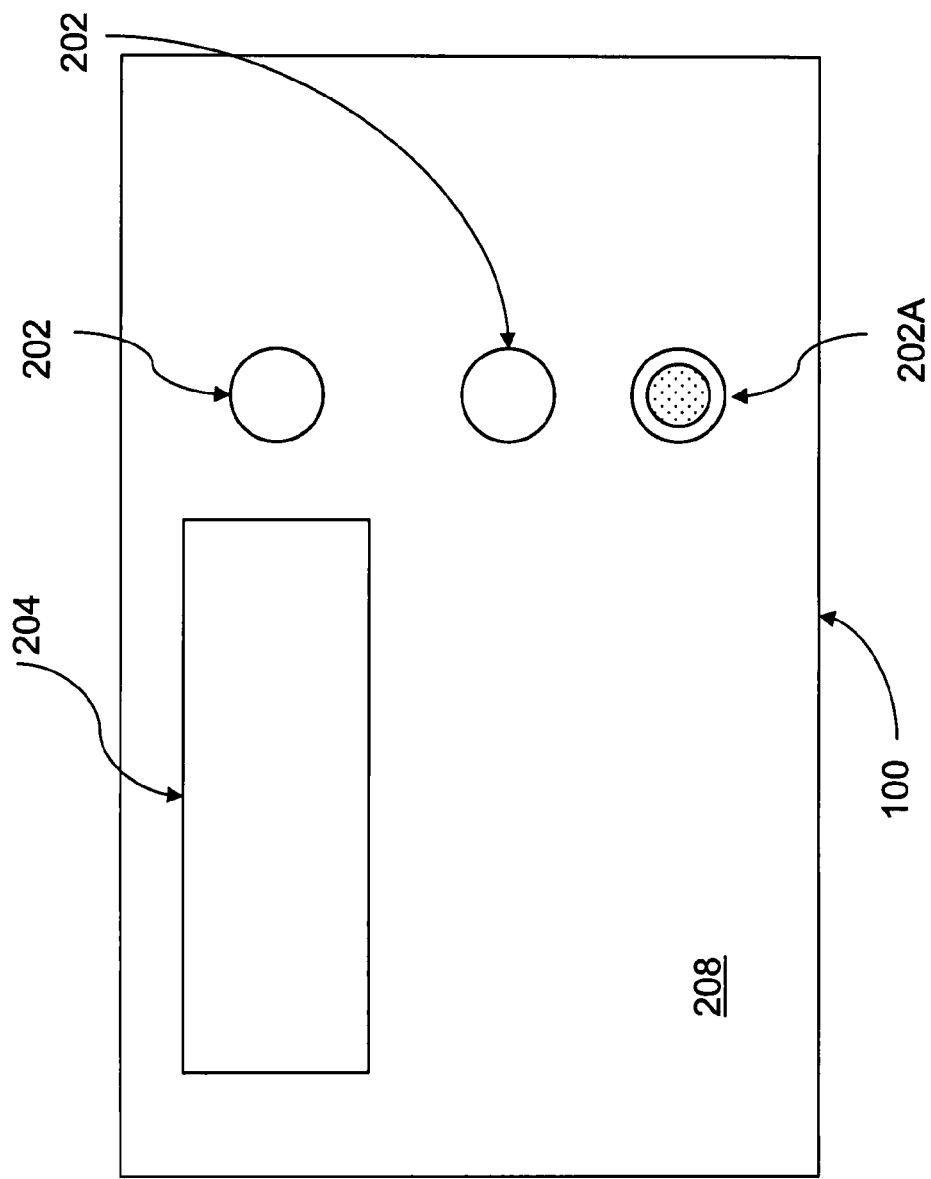
FIG. 4d is a block diagram showing components of an IC for translating control signals to and from advanced testing equipment and stimulus and response signals to and from a DUT.

FIG. 3d is a diagram showing multiple APIC 204 testing a single DUT (not shown). FIG. 3e-3g show APICs with alternate companion ground lines. FIG. 3e illustrates a single probe 202 with a single ground 225, FIG. 3f illustrates a single probe 202 with dual grounds 225, and FIG. 3g illustrates a dual probe 202 with dual grounds 225. These types of configuration at the probe end 202 are known as GS, GSG and GSSG, respectively.

FIG. 4a-4d are block diagrams illustrating four embodiments of probe card 100 comprising different type of probes 202. It will be recognized that the examples shown are for illustrative purposes, showing several among the architectures available, and are non-limiting. For example, as shown, probe card 100 may have a probe needle 202, a wireless probe 202A, and an antenna 222 to allow for wireless communication, which may or may not be mounted on active probe 204.

Figure 5G:
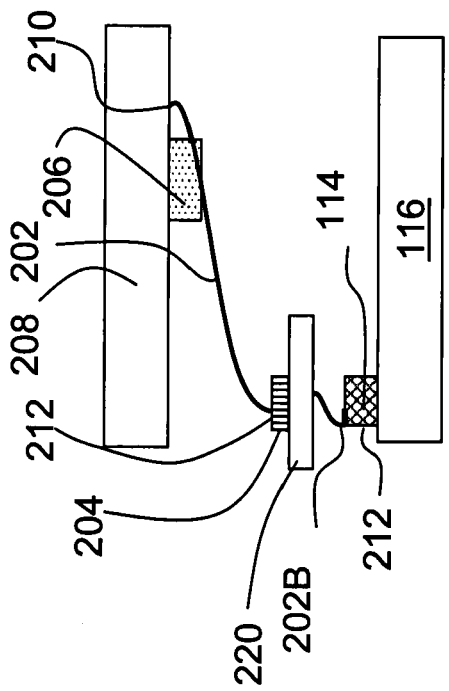
Figure 5F:
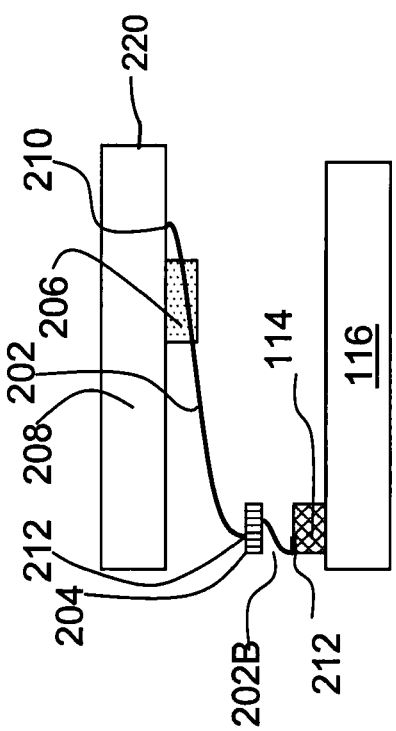

FIG. 5a-5f illustrates six of the various possible options for relative placement of combinations of probe 202 and a corresponding APIC 204 or probe 202 and corresponding substrates 220 having APIC 204. A mechanical support 206, typically epoxy resin, secures cantilever probe 202 to a substrate 208. APIC 204 can be situated at a proximate end 210 of probe 202 as illustrated in FIG. 5a, within mechanical support 206 as illustrated in FIG. 5b, on mechanical support 206 as illustrated in FIG. 5d, adjacent mechanical support 206 as illustrated in FIG. 5c, or between mechanical support 206 and a distal end 212 of probe 202. In FIG. 5a-5d, probe 202 is situated so that distal end 212 is able to make contact with a selected contact point 114 on DUT 116. FIG. 5e illustrates an option whereby APIC 204 is in contactless communication with DUT 116 through the use of antennae 222 situated on each of APIC 204 and antennae 222 on contact point 114 of DUT 116. In this embodiment APIC 204 may be one component of a substrate 220 for non-contact testing of DUT 116. Alternatively, antennae 222 may be located on substrate 220 to facilitate communication between APIC 204 and DUT 116. In this embodiment, when substrate 220 is in close proximity to DUT 116, signals are transmitted between ATE 110 and DUT 116 using antennae 222 situated on each of substrate 220 and DUT 116. FIG. 5f illustrates another embodiment in which APIC 204 at distal end 212 of probe 202 has a contact 202B for contacting DUT 116 for purpose of electrical communication. FIG. 5g illustrates another embodiment in which substrate 220 at distal end 212 of probe 202 has a contact 202B for contacting DUT 116 for purpose of electrical communication.

FIG. 6a through 6i are schematic diagrams of different embodiments of probes having inlet/outlet ports and an IC used for translating control signals to and from advanced testing equipment and stimulus and response signals to and from a DUT.

Referring to FIG. 6a through 6c, substrate 220 has a tester interface 214, a DUT interface 216, and an APIC 204 that may be a signal test processor 224. Thus, DUT interface 216 of APIC 204 is electrically connected to probe 202 for communication of stimulus (for example, high frequency) signals 218 between APIC 204 and DUT 116. Tester interface 214 is for communication of control signals (such as low frequency analog, digital or a combination of digital and analog signals) 219 between APIC 204 and ATE 110 electronically using hardwire connections and/or by wireless signals transmitted using radio frequencies or light. Signal test processor 224 transforms signals 219 received from ATE 110 to signals 218 for transmission to DUT 116 via probe 202, and transforms signals 218 received from DUT 116 to signals 219 for transmission to ATE 110. The sequencing is illustrated in FIG. 9a through 9c. Signals 218 and 219 may be low frequency, high frequency, radio frequency, low precision, high precision, DC or digital.

DUT interface 216 may be an antenna, a MEMS probe 202C on substrate 220 as shown in FIG. 6b, wired for electrical communication, or a hybrid of these options. Alternatively, APIC 204 may be in "flip chip" orientation and electrically connected to substrate 220 using solder balls or other means familiar to those skilled in the art.

Figures 6D, 6E:
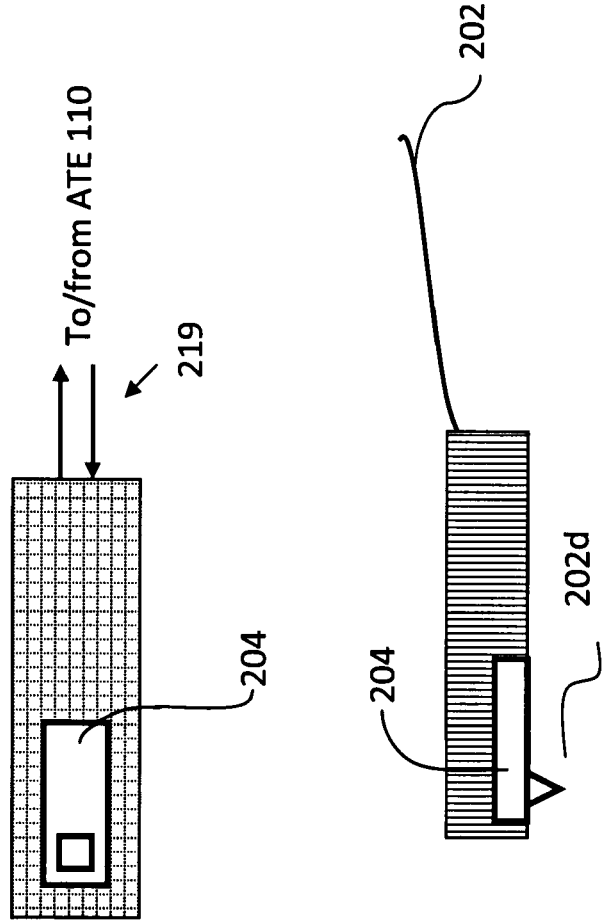
FIG. 6d is a bottom view of the chip shown in FIG. 6d.
FIG. 6e is a side view of the chip shown in FIG. 6d.

FIGS. 6d and 6e are diagrams of another embodiment of a chip having integrated high speed probe structures with a plurality of inlet/outlet ports and an IC used for translating control signals to and from advanced testing equipment and stimulus and response signals to and from DUT 116, similar to that illustrated in FIG. 6a through 6c. In the embodiment shown in FIGS. 6d and 6e, an integrally incorporated probe 202d is created from the body of the APIC 204 using one of many known MEMS fabrication techniques. These techniques can be used to add a microfabricated probe tip structure 202d during manufacture, or to create a microfabricated probe tip structure using subtractive processes. Probe tip 202d has a modified probe contact created out of the body of the APIC 204.

FIGS. 6f and 6g are diagrams of a further embodiment of APIC chip having substrate 220 and APIC 204, providing serialization and de-serialization function close to the circuit under test. In this embodiment APIC 204 has electrical communication channels 219a for multiple parallel low speed signals for interfacing the ATE 110 side while the DUT 116 side has serial high speed lines 218. Lines 219a and 202a show multiple signal channels for interfacing with ATE 110.

Figure 6J:
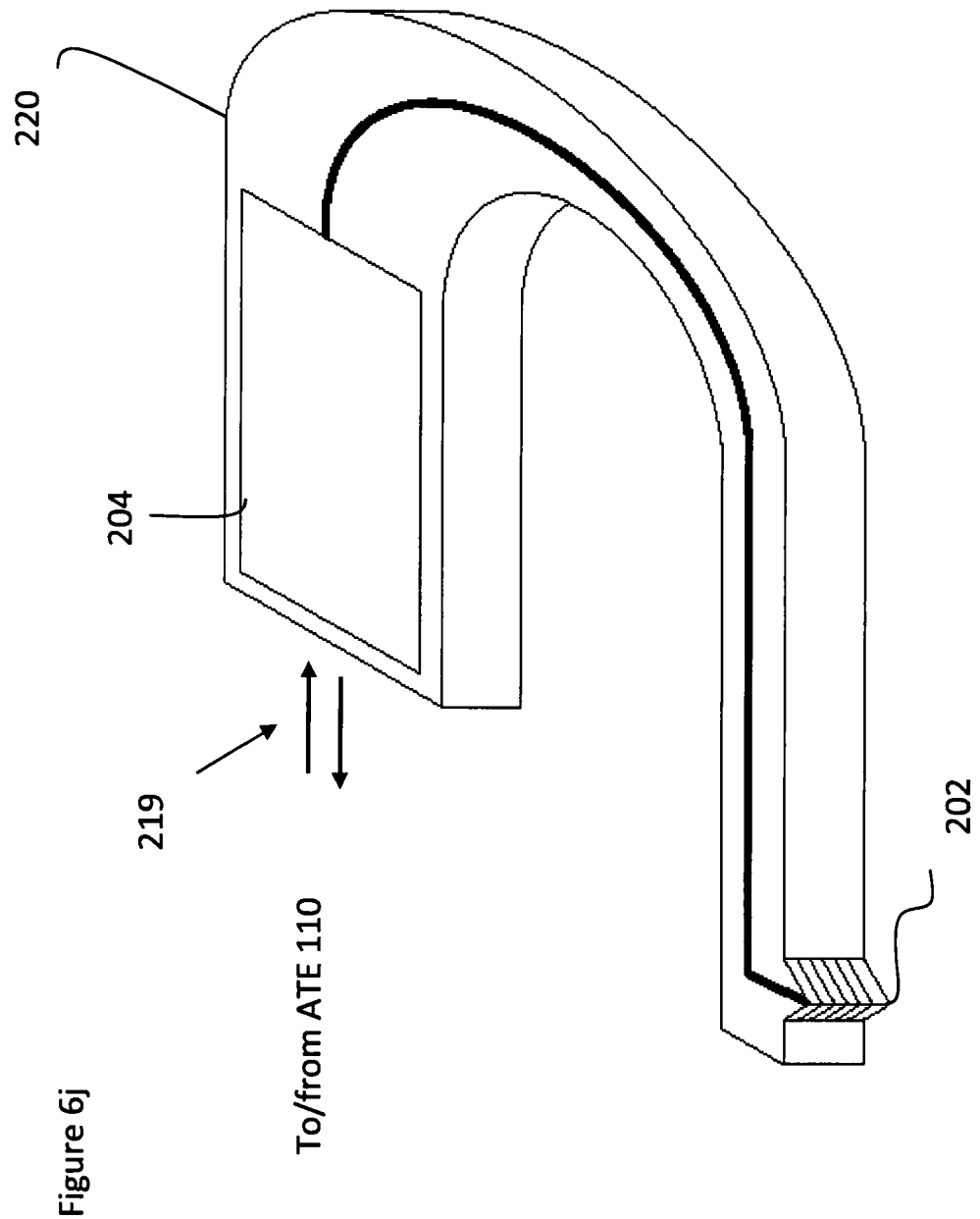
FIG. 6j is a perspective view of a monolithic APIC and probe.
Figure 6I:
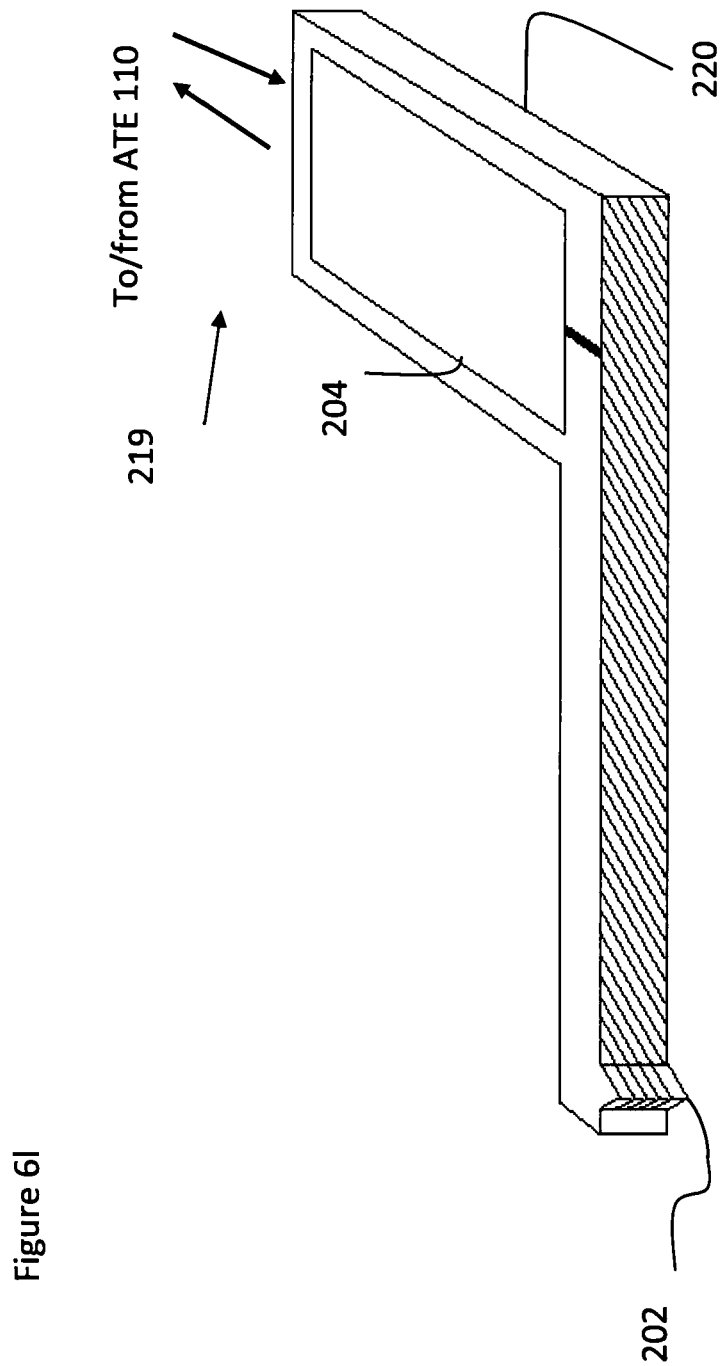
FIG. 6i is a side view of the chip shown in FIG. 6h.

FIGS. 6h and 6i are diagrams of another embodiment of APIC 204 chip providing memory testing functions as well as serialization and de-serialization function close to the circuit under test. In this case APIC 204 has multiple parallel low speed signals for interfacing the ATE 110 side while the DUT 116 side has serial high speed lines. In this embodiment a component 220a provides memory test patterns at high speed to DUT 116. This enables low speed lines to interact with the APIC 204 chip and the memory testing can be off loaded from the tester 110. Item 224a is the memory testing block within the APIC 204 IC.

FIG. 6j shows a perspective view of a monolithic APIC and probe which can be constructed using known techniques out of one monolithic piece of silicon. In this case the probe tip and arm and body are integral with the APIC processing elements enabling high volume extreme precision in the production and signal processing.

FIG. 6k shows a perspective view of a monolithic APIC and probe with divisional signal processing which is enabled by the monolithic construction of the probe, probe arm, and APIC processing elements. This figure creates a two level processing APIC in which the APIC element 204A is the back end interfacing to ATE equipment while the APIC element 204B is the front end used for processing signals at the tip end. This enables very high fidelity signal processing with virtually no signal loss and noise. The advantage of the APIC concept with monolithic construction enables various probe shapes to be created out of the same base APIC substrate. An example embodiment of divisional processing may be a pre-amplifier at APIC 204B while APIC 204A may contain digital signal processing. This can be used for a variety of applications including RF, Memory, and SerDes etc.

FIG. 6*l* shows a perspective view of a monolithic APIC and probe with a straight lever arm on the probe side of the monolithic body. This has utility in that the length of the arm can be created to minimize DUT probe damage based on the technology of the DUT.

Figure 6M:
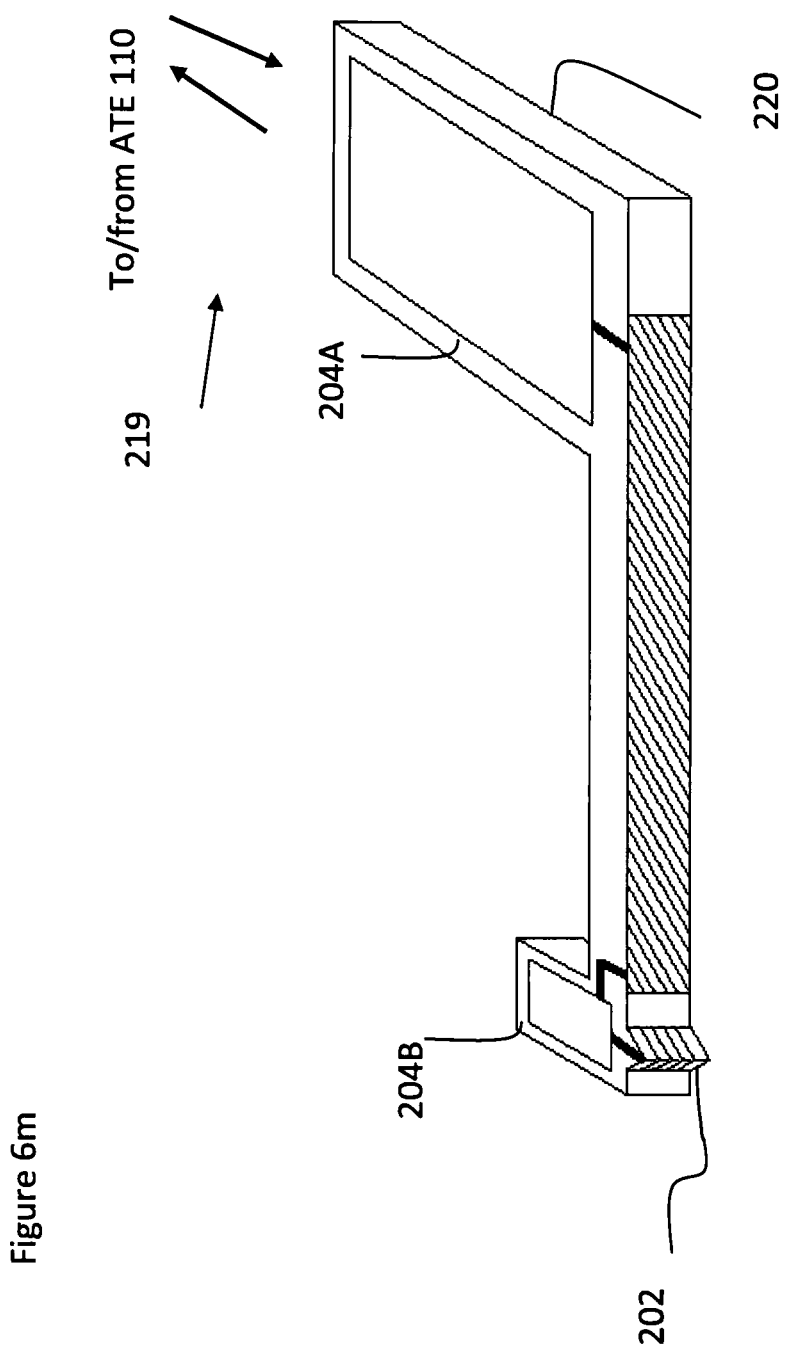
FIG. 6m is a perspective view of a monolithic APIC and probe with divisional signal processing.

FIG. 6*m* shows a perspective view of a monolithic APIC and probe with divisional signal processing with a straight lever arm Probe.

FIG. 6*j* through 6*m* show a method for mass production of APICs. In addition to the enhanced signal processing, the monolithic elements can be more easily placed in a probe card because of the 'handle' of the monolithic element which is easier to handle than individual probe needles.

From the variety of embodiments that can be engendered, it will be recognized that the apparatus is not limited in application to high speed RF signals. The apparatus describe herein provides advantages to several application areas where the APIC IC can be designed to optimize a particular application.

FIGS. 6*f* and 6*g* show that SerDes is an application area where the apparatus can provide advantages over current techniques. In this case, the very high speed SerDes signals are conditioned by the APIC device enabling these high speed signals to be effectively tested using standard ATE. This embodiment of APIC 204 can be used to condition, amplify or even provide a local Serialization or De-serialization function to enable low speed ATE 110 to be used by sending the lower speed signals through the probe card and thus to ATE 110.

In a manner substantially similar to that for RF or SerDes interfacing, APIC 204 can be designed to interface to high speed signals used for memory systems such as static or dynamic RAM. Such devices have very high demands on speed of signals from testers. In this case, at least one APIC 204 can provide very high speed signals and level testing within DUT 116. This application area can also benefit from an APIC 204 providing some intelligence for memory testing as well as a SerDes function to enable lower speed testing to be carried out, shown in FIGS. 6*h* and 6*i*.

Similarly, different embodiments of APIC 204 can be designed to facilitate parametric testing of devices. This would include the APIC providing, conditioning and sensing power supply lines. Currently, parametric testing is limited to low frequencies by the limitations of the probe card and ATE speeds. In contrast, for this application an APIC 204 can enable very high speed parametric testing using normal ATE infrastructure. These limitations also limit packaged test or Strip Testing. As an application of the APIC, signal testing for package or strip testing can be enhanced. Conventionally only specialized probe cards and single sited locations can be utilized. With APIC 204, multiple high speed parametric testing can be carried out. In a similar manner to SerDes the APIC IC can be designed to include parametric measurements or conditioning. An example of this is high speed transistor testing for which the high speed parameters are difficult to obtain using low speed methods.

Figure 7A:
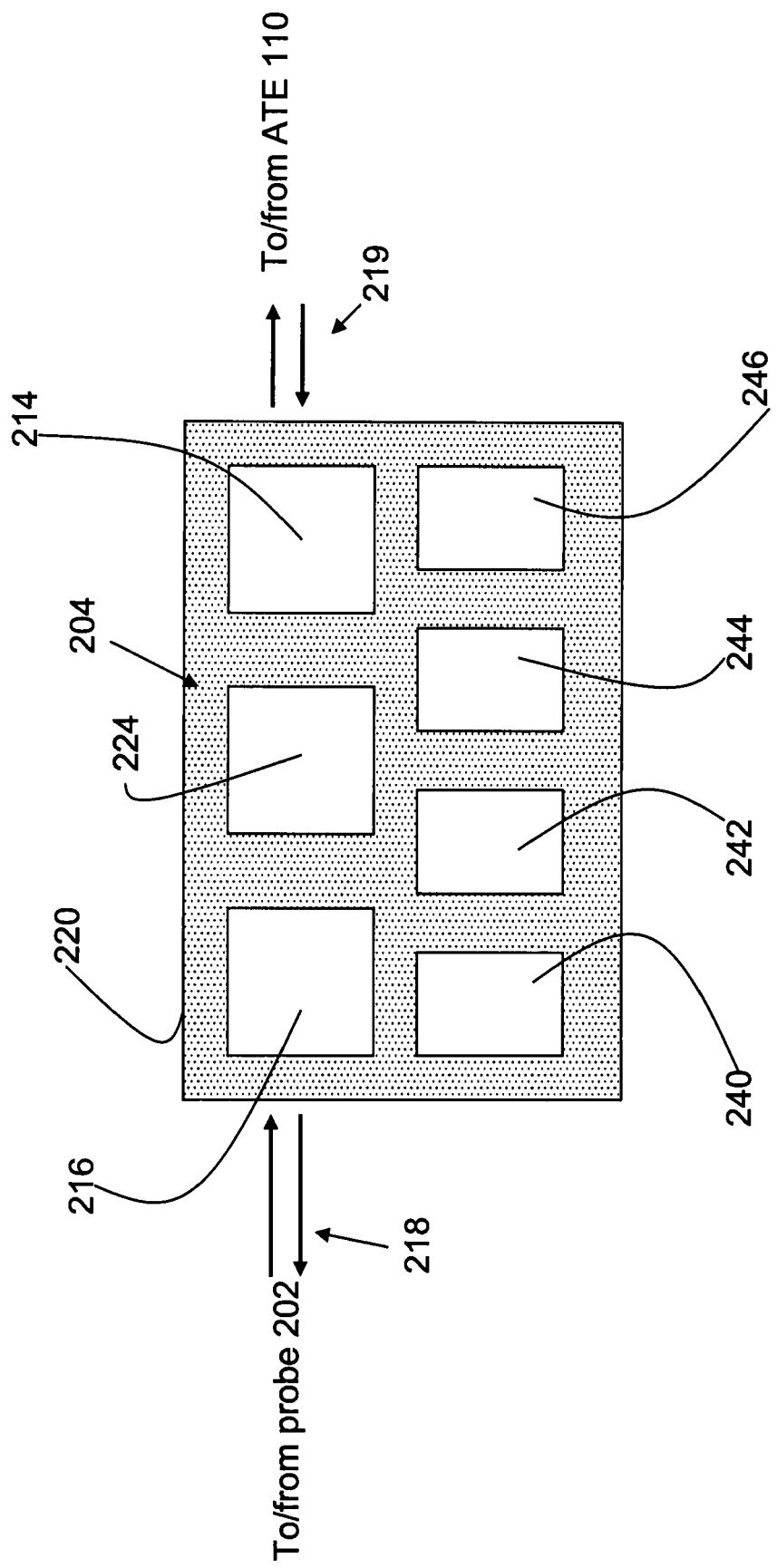
FIG. 7a is a schematic diagram showing the components of a chip designed for interpreting data from a DUT.
Figure 7B:
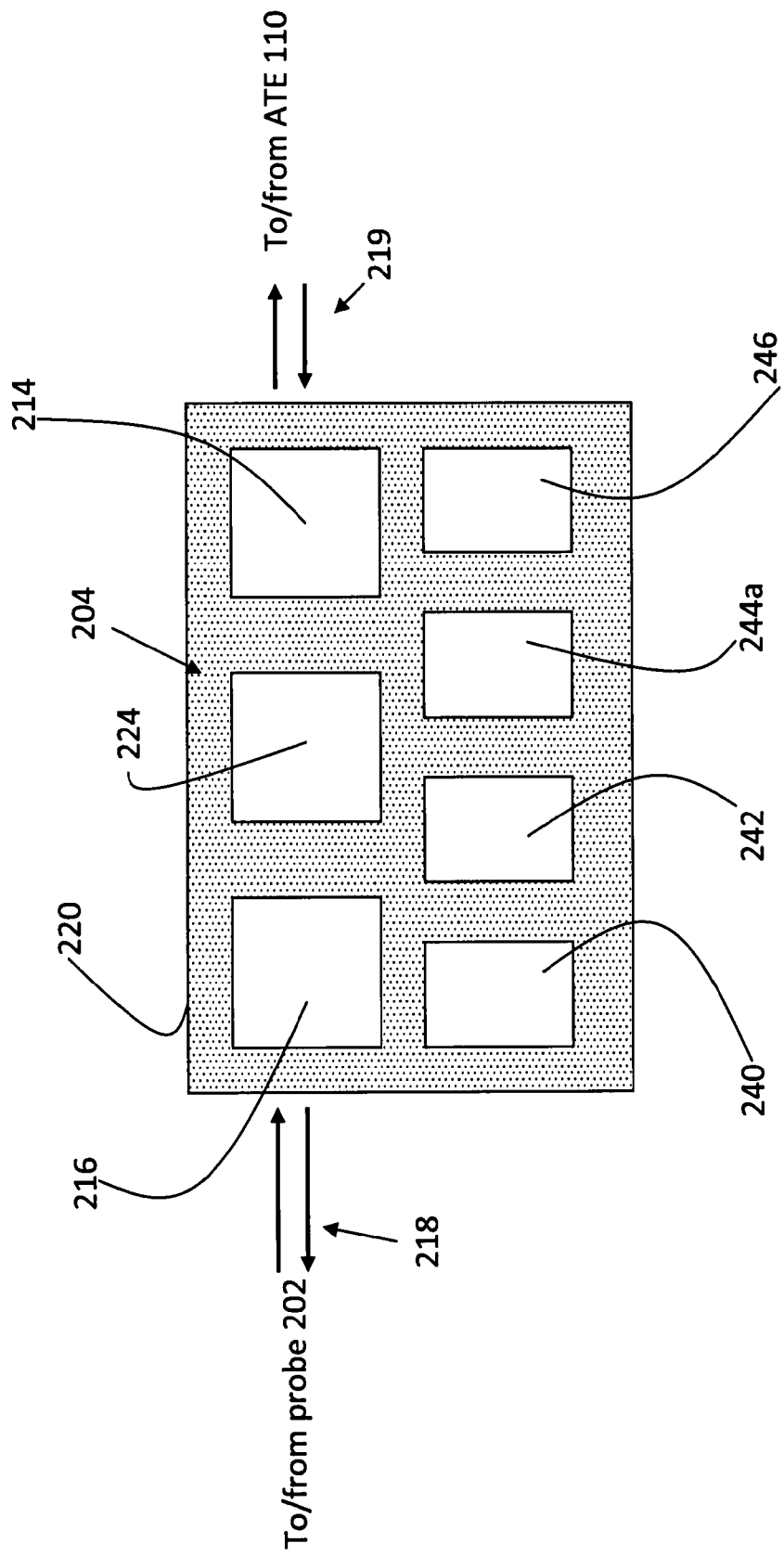
FIG. 7b is a diagram of an APIC which includes a source measurement unit (SMU).

FIG. 7*b* shows another embodiment APIC which in this case includes a source measurement unit (SMU) 244*a* which is typically on the ATE equipment. In this embodiment, SMU 244*a* is incorporated with or is part of APIC 204, thus providing both higher speed and lower interference from long signal runs.

While the discussion shows the advantages of using APIC technique on wafers or ICs, an application area that would benefit is that of advanced packaging. In advanced packaging multiple ICs are combined together to form a module or composite IC. These packaging techniques are limited to low speed testing. APIC can be used for high speed testing of these devices. Applications include System in Package (SIP) of various kinds with active or passive substrates as well as packaging techniques which redistribute signals such as Redistributed Chip Package (RCP) or chip on substrate or laminate packaging. Strip testing of multiple ICs is another application. In this case appropriate embodiments of APIC 204 can be used to test in-process or final packaged parts at both high speed and medium and/or low speed, thus providing greater coverage than is currently available.

A further option is that components may be constructed as chip-in-chip.

Advantageously, APIC 204 is programmable, as illustrated in examples shown in FIGS. 7*a*, 7*b*, 8*a*, 8*b*, 8*c* and 8*d*. FIG. 7*a* shows schematically the components of a programmable APIC 204. FIGS. 7*a* and 7*b* illustrate that an APIC 204 can contain signal processing and conditioning elements within one IC body which can carry out various processes such as power conditioning/monitoring, RF signalling and conversion/monitoring, High speed serial signalling or high speed memory interface conditioning. These functions do not have to be individually fabricated but can be controlled to be active via the ATE interface signals 219.

Figure 8A:
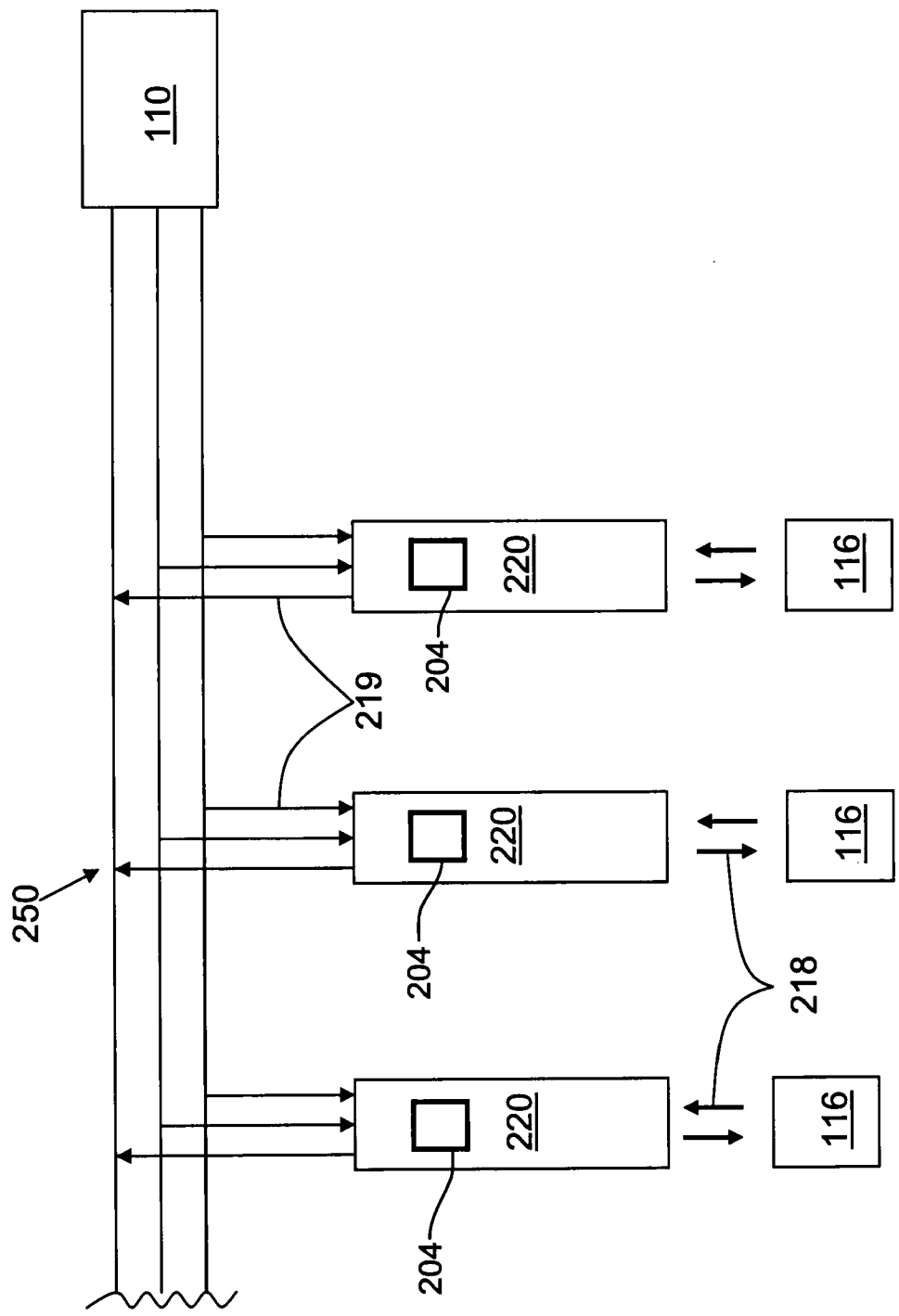
FIG. 8a is a schematic diagram of a plurality of chips that are severally in hardwired communication with advanced testing equipment via a bus.
Figure 8B:
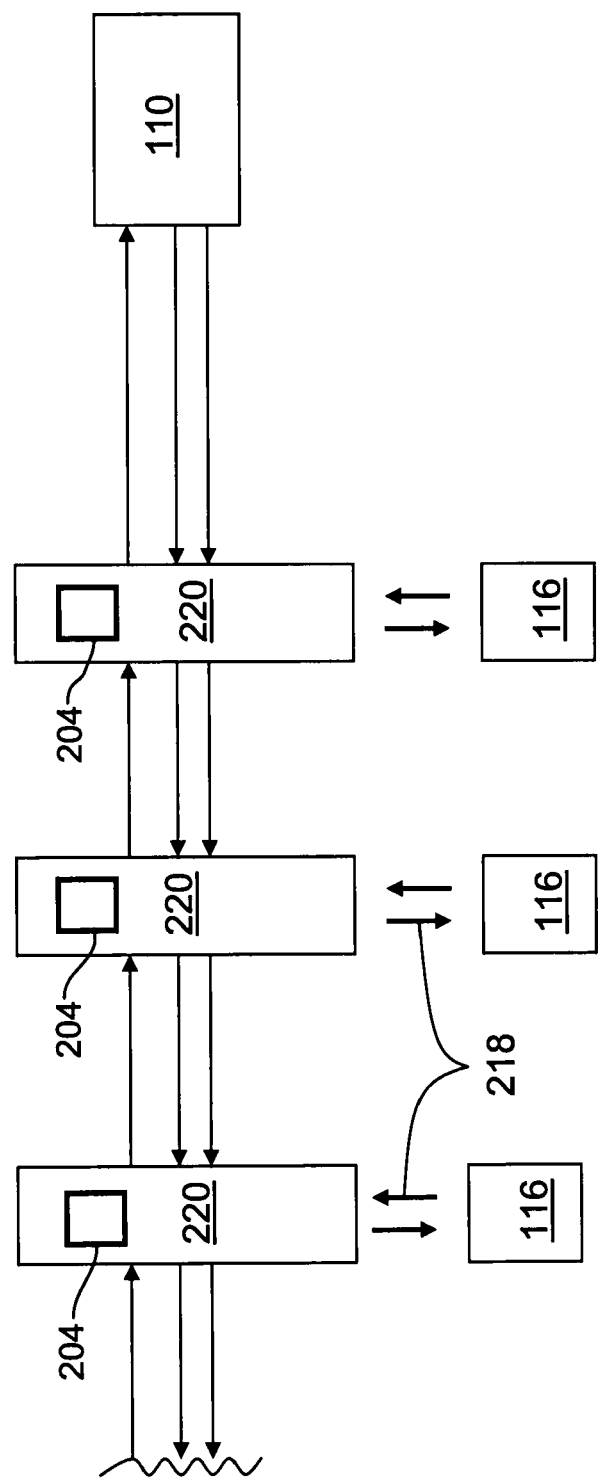
FIG. 8b is a schematic diagram of a plurality of chips that are sequentially in communication with advanced testing equipment and, optionally, each other.
Figure 8C:
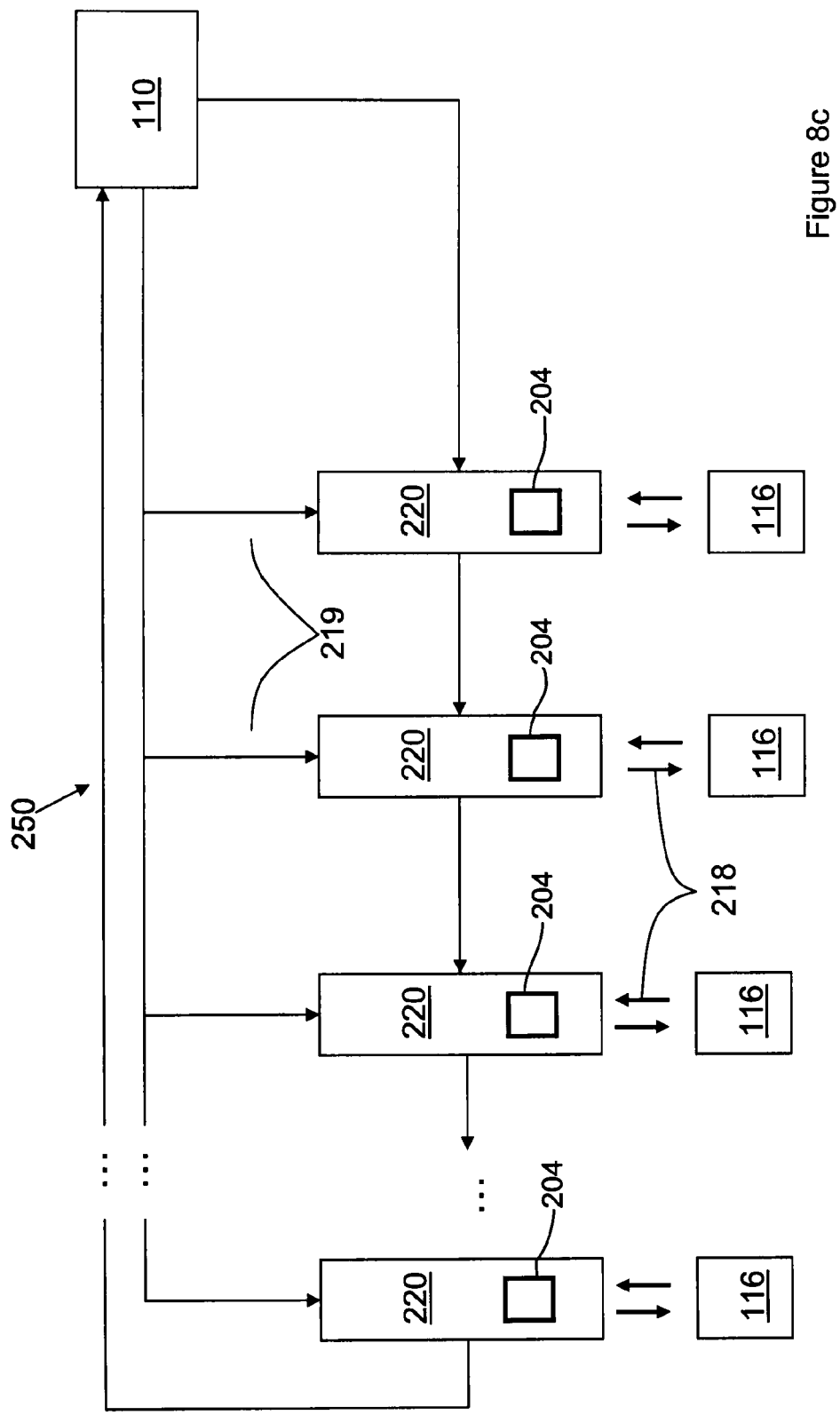
FIG. 8c is a schematic diagram of a plurality of chips that are in communication with advanced testing equipment via a bus and with each other serially.
Figure 8D:
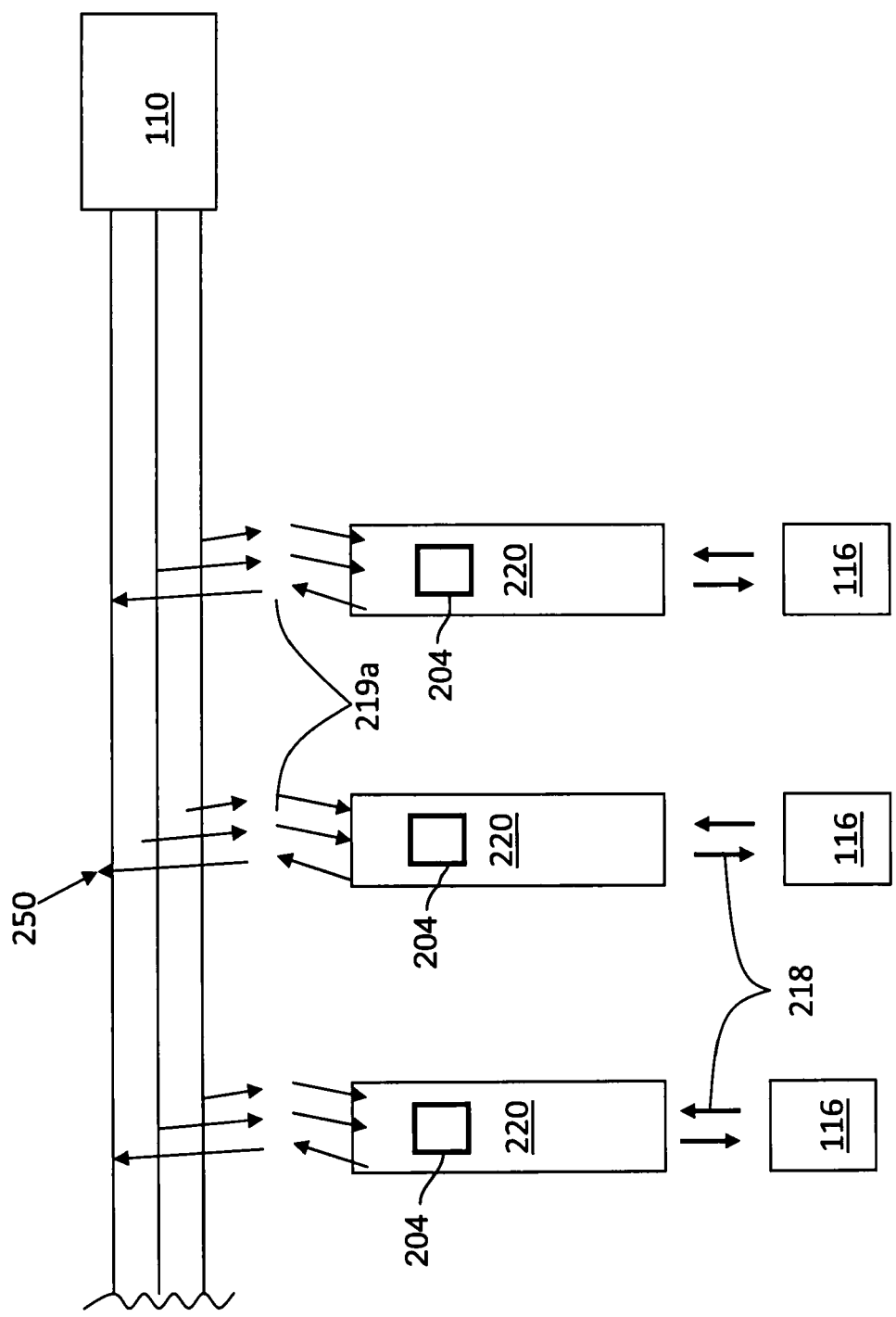
FIG. 8d is a schematic diagram of a plurality of chips that are severally in wireless communication with advanced testing equipment and, optionally, each other.
Figure 9:
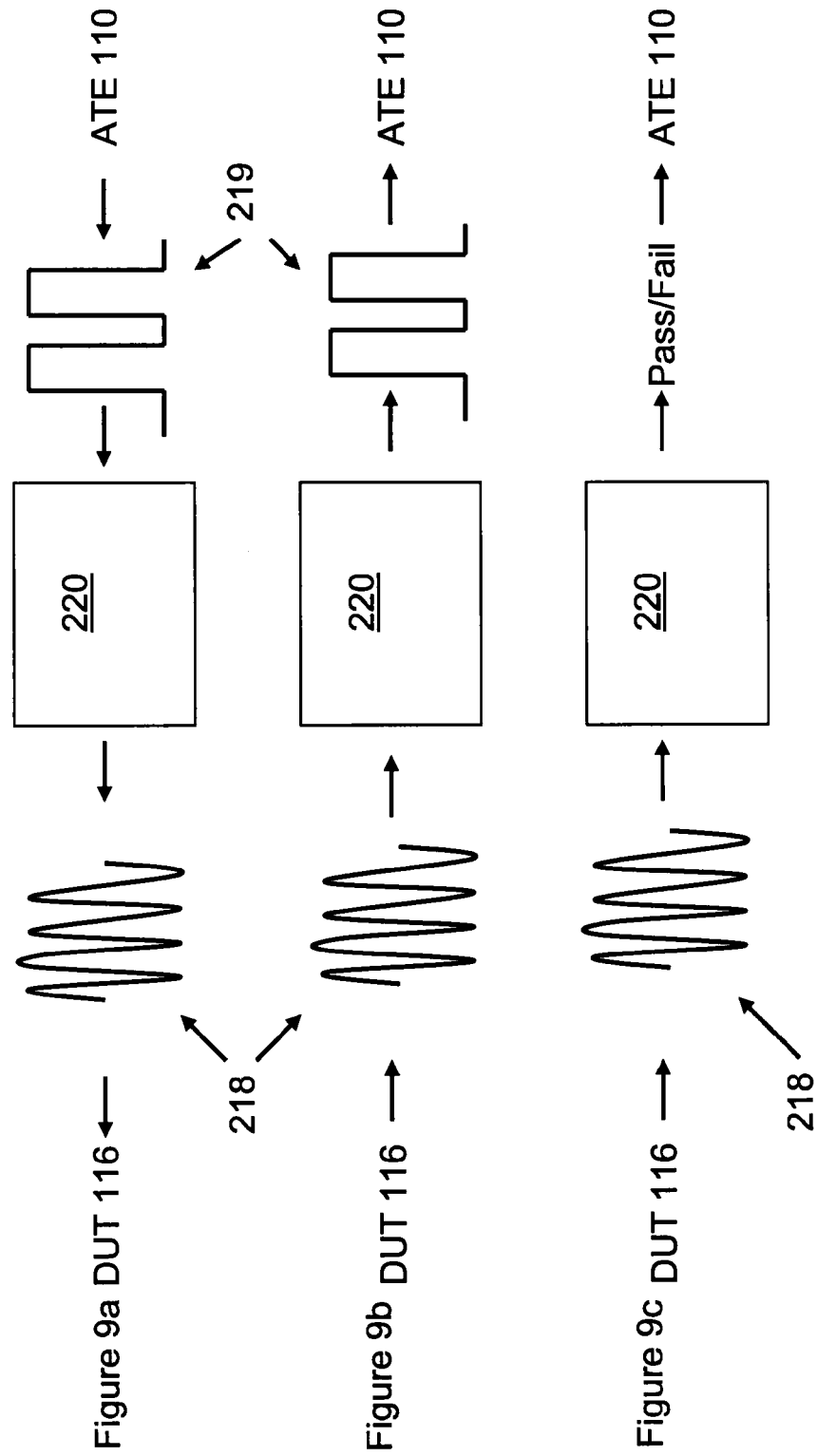
FIG. 9a is a diagram illustrating the transformation at an IC of a low frequency signal from advance testing equipment transformed to a high frequency signal for communication to a DUT.
FIG. 9b is a diagram illustrating a high frequency signal from DUT transformed at an IC to a low frequency signal for communication of the same data to the advanced testing equipment.
FIG. 9c is a diagram illustrating a high frequency signal from a DUT interpreted by the IC and the results from the test communicated to the advanced testing equipment.

FIG. 7*b* shows another embodiment of APIC 204 that includes a source measurement unit (SMU) 244*a* instead of a comparator 244 shown in FIG. 7*a*. FIG. 8*a* shows schematically a series of APIC 204 independently in communication with ATE 110 via a high speed bus 250. FIG. 8*b* shows a series of APIC 204 connected in series with ATE 110. FIG. 8*c* shows a series of APIC 204 in communication with ATE 110 via bus 250 and with each other. FIG. 8*d* shows a wireless interface for communications signals 219*a* between APICs and the ATE probe card signals.

Referring to FIG. 7*a*, substrate 220 may include tester interface 214, DUT interface 216, APIC 204 programmed for signal conditioning 224, a memory 240, a controller 242, a comparator 244 and A/D-D/A switching capability 246.

Preferably, substrate 220 has the components illustrated schematically in FIG. 7*a*. ATE 110 sends signals to program individual APIC 204 to conduct a specific test or tests. Each probe 202 is in communication with a different corresponding APIC 204. Each corresponding APIC 204 can be individually programmed to conduct a specific test or tests, and so several tests on one or more DUT 116 can be performed in parallel using several probes 202. For example, ATE 110 may program one specific APIC 204 to configure its function as a low noise amplifier, a high frequency signal generator, an I/O cell, or some other function. At the same time, ATE 110 can program another APIC 204 to configure its function differently. In this manner, ATE 110 may sequence and program several APIC 204 to perform several different tests on one or more DUT 116.

The ability of ATE 110 to perform several tests in parallel confers advantages through use of test head 200 over use of all prior art systems. In the prior art ATE 110 conducted tests on DUT 116 in sequence.

While the majority of the discussion herein described high speed wired signals, the apparatus is not limited to hardwired systems. Alternatively APIC 204 can be implemented with a wireless ATE interface. FIG. 8d shows a wireless interface connection between multiple APIC 204 and the ATE probe card, showing communications signals 219a. It will be recognized that not only wireless communications can be sent over this link but, as well, power can be sent to provide power to APIC 204 and any DUT 116 connected to it. RF power can be converted to DC power in APIC 204 for internal and external use. This provides very high isolation and signal integrity, thus enabling more applications for APIC 204 when compared with hardwired techniques.

A further advantage accrues when APIC 204 is programmed to analyze the response from DUT 116. Referring to FIG. 9a through 9c, when substrate 220 having features illustrated in FIG. 7a is used, substrate 220 may be programmed to compare incoming (FIG. 9a) and outgoing signals (FIG. 9b) from DUT 116, data from DUT 116 against standard data, or other analytical functions. APIC 204 analyzes the data from DUT 116 and conveys the result from the analysis to ATE 110. Thus there is no need to transmit all data from DUT 116 to ATE 110, with consequent saving of transmission time and signal bandwidth. For example, a test conducted on DUT 116 may result in a simple pass/fail decision. In this case, APIC 204 transmits this result to ATE 110, as illustrated in FIG. 9c, instead of the plurality of data that led to this result, resulting in time savings for ATE 110 functions and more rapid test sequencing.

Figure 10A:
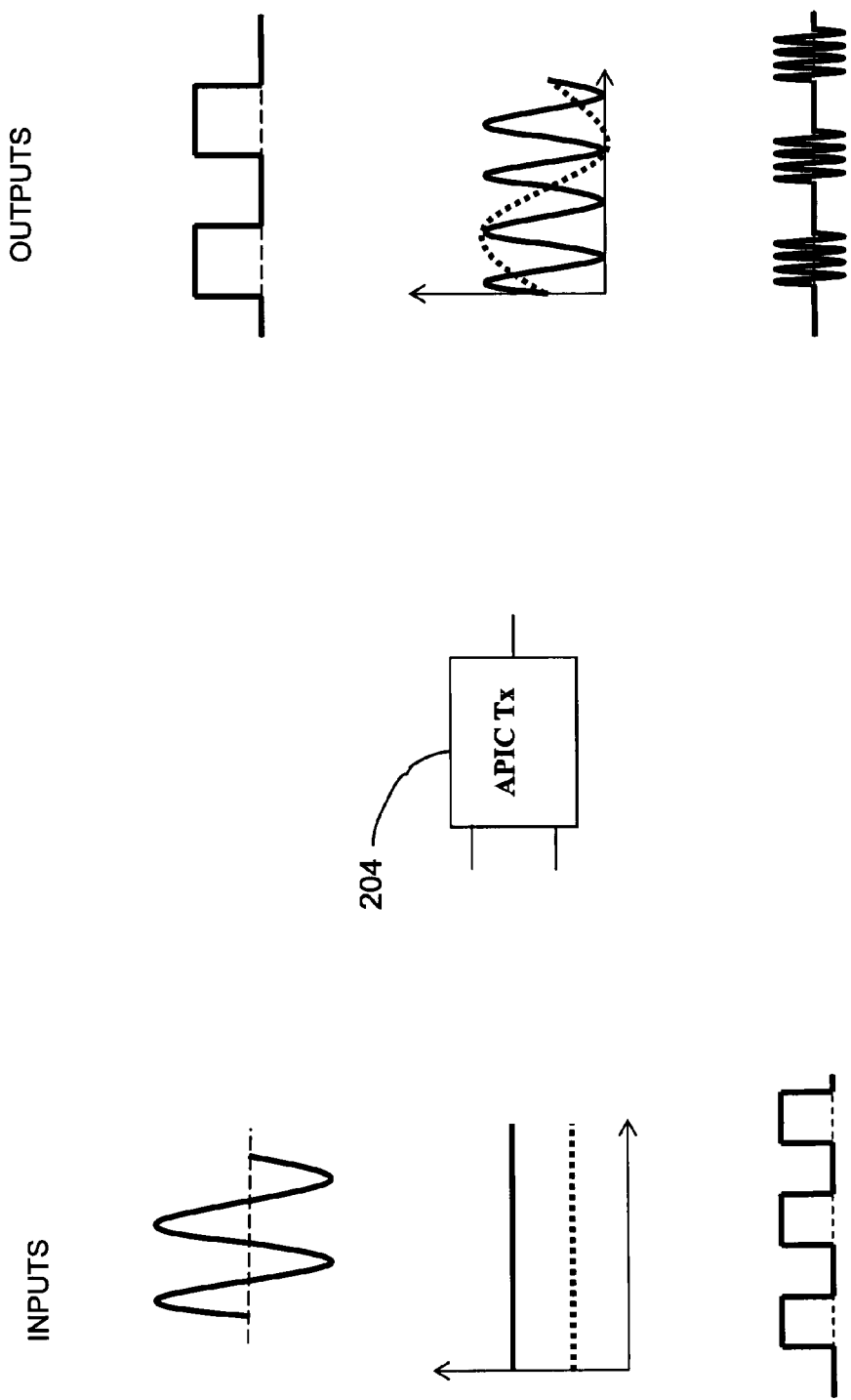
FIG. 10 illustrates the types of signal transformations using the active probe IC in either (a) transmitter mode or (b) receiver mode.

FIG. 10a shows examples of signal transformations using APIC 204 in transmission mode, sending signals from ATE 110 to DUT 116. FIG. 10b shows examples of signal transformations using APIC 204 in receiver mode, sending signals from DUT 116 to ATE 110.

Figure 11:
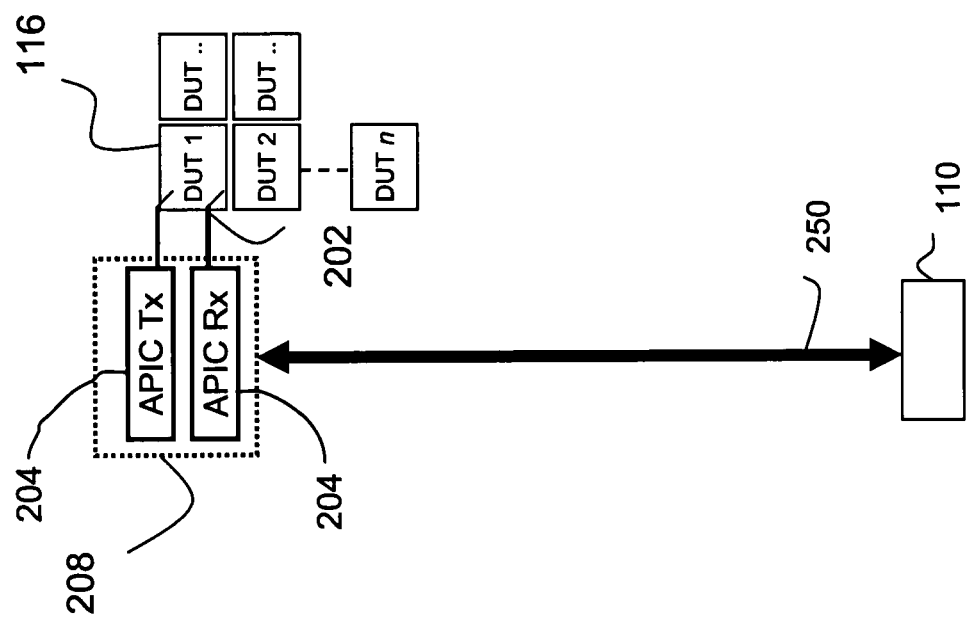
FIG. 11 illustrates the sequential performance of one test on one DUT within a series of n DUT.

FIG. 11 shows schematically testing of several DUT 116 using testing equipment which may be high speed ATE but using APIC to provide enhanced signal conversion/conditioning.

Figure 12:
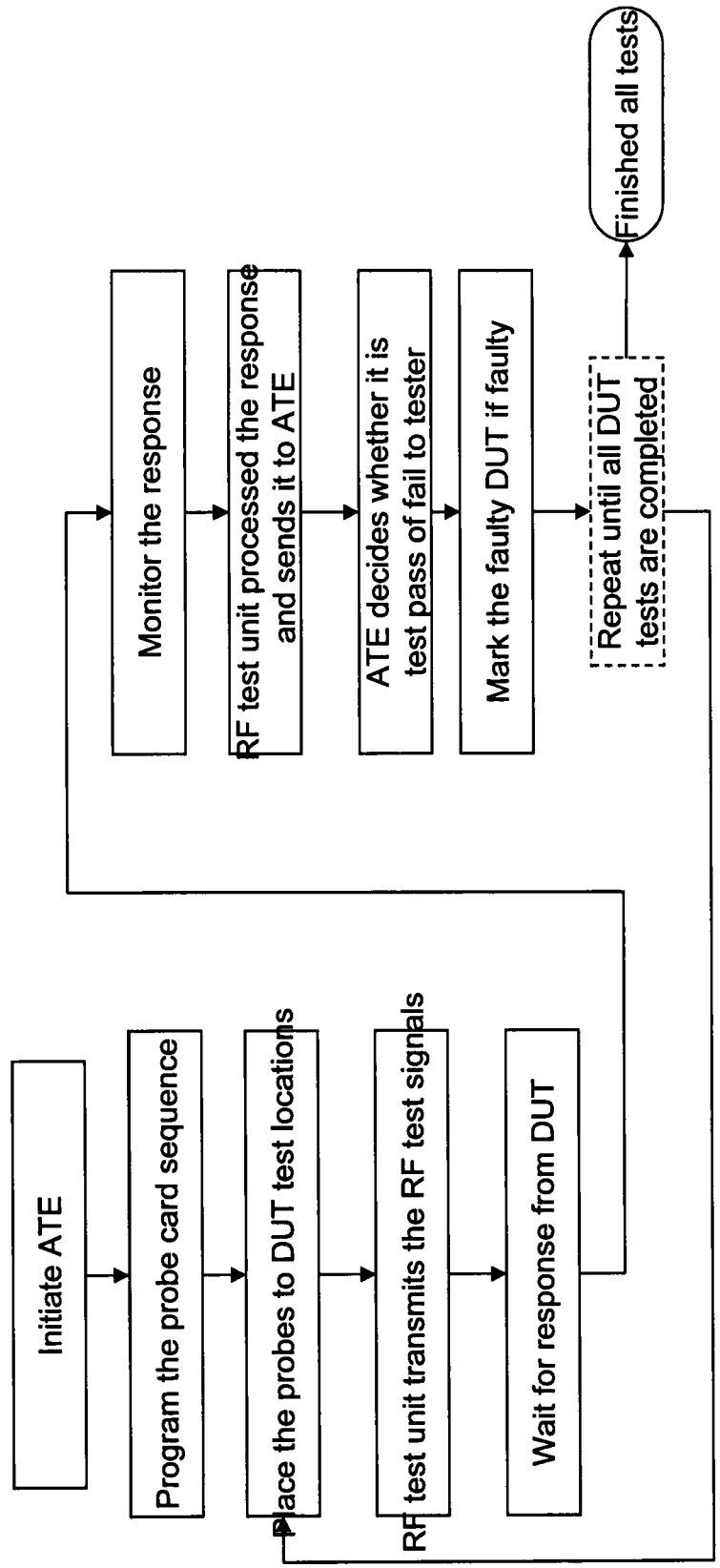
FIG. 12 shows a protocol for conducting sequential testing of DUT.

FIG. 12 shows one protocol for conducting testing of DUT 116 using prior art testing equipment. Tests necessarily are conducted on one or very few DUT 116 at any one time and, if more than one test is needed, such tests are conducted sequentially. A consequence is that testing is a time consuming process.

Figure 13A:
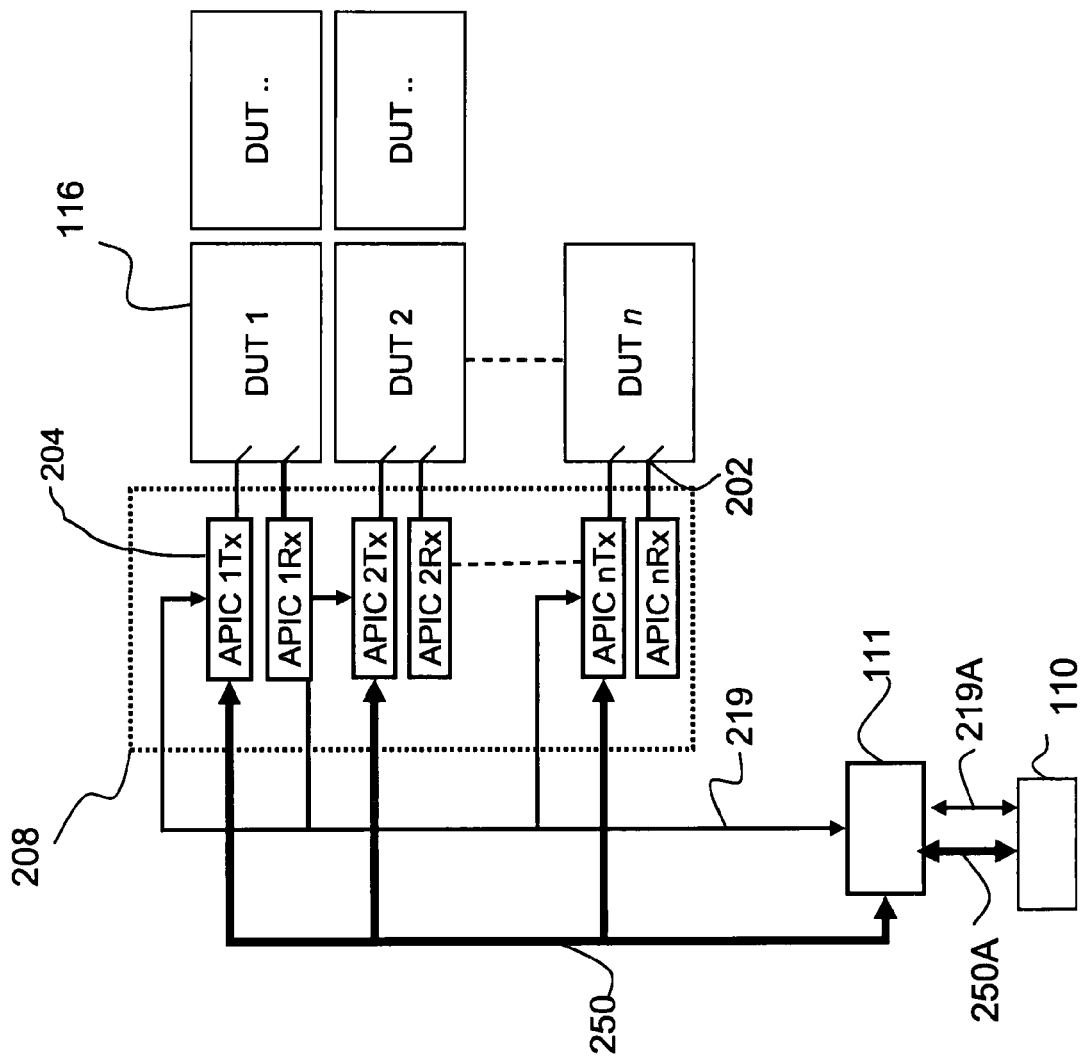
FIG. 13a illustrates simultaneous, parallel performance of tests on several DUT using active probes.
Figure 13B:
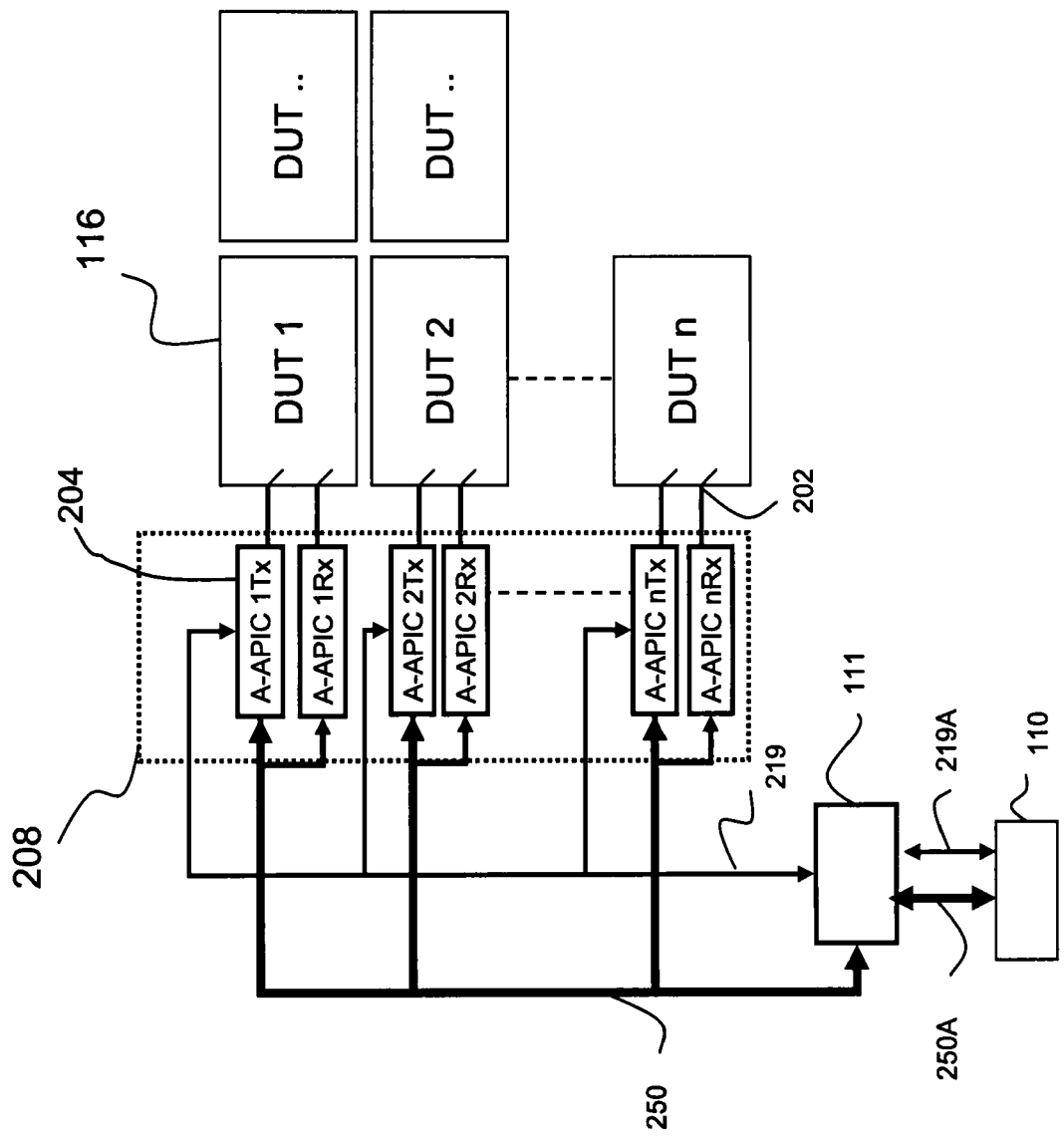
FIG. 13b illustrates simultaneous, parallel performance of test on several DUT using advanced active probes that can be configured as needed.

FIGS. 13a and 13b illustrate the use of a plurality of active probes 202, each having APIC 204, for simultaneous, parallel testing of several DUT 116. Optionally, one test can be conducted on several DUT 116, or several tests can be conducted on any one DUT 116, or several tests can be conducted on several DUT 116 in parallel.

Figure 14:
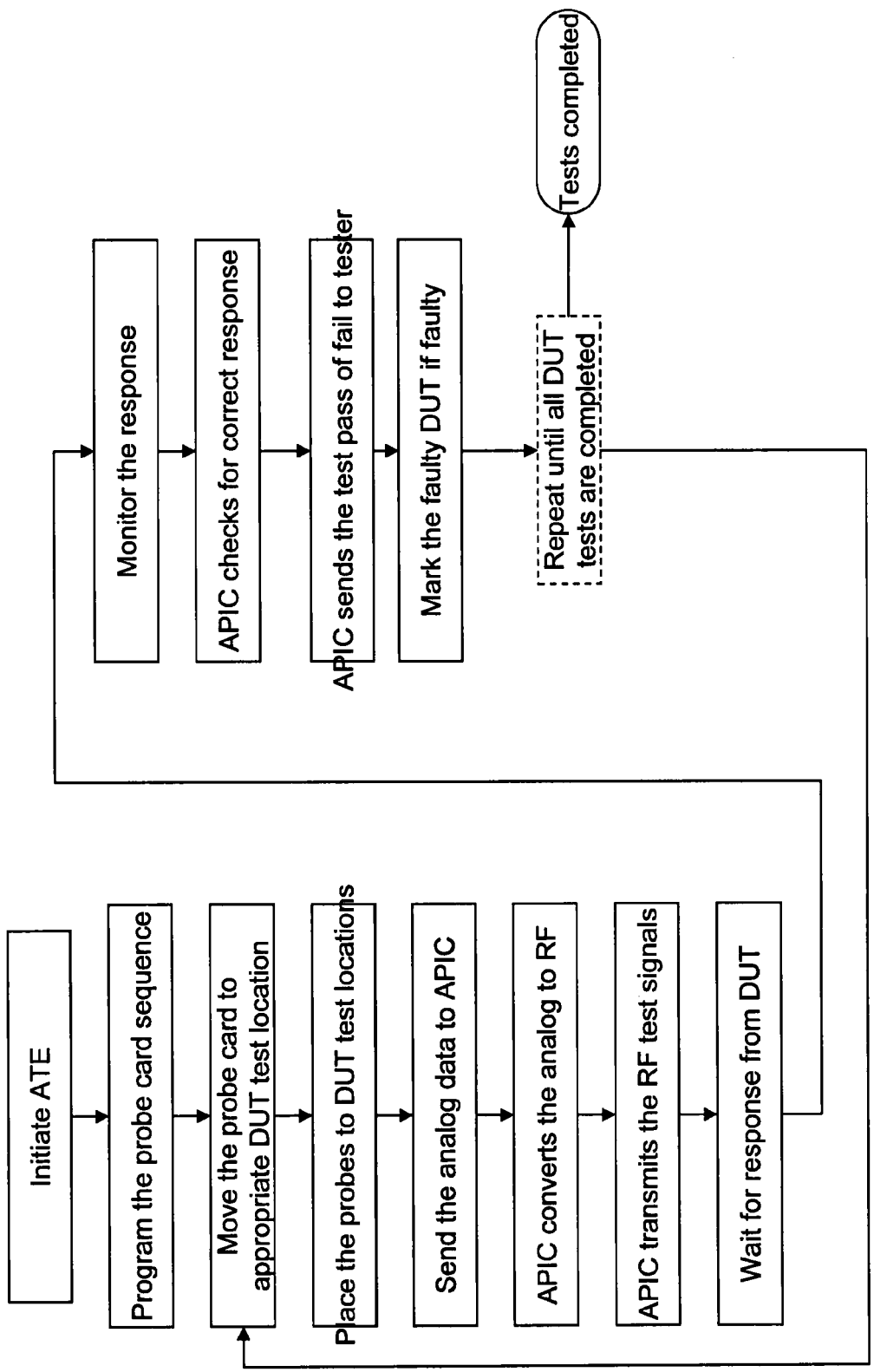
FIG. 14 shows a protocol for sequential testing of DUT using active probes.
Figure 15:
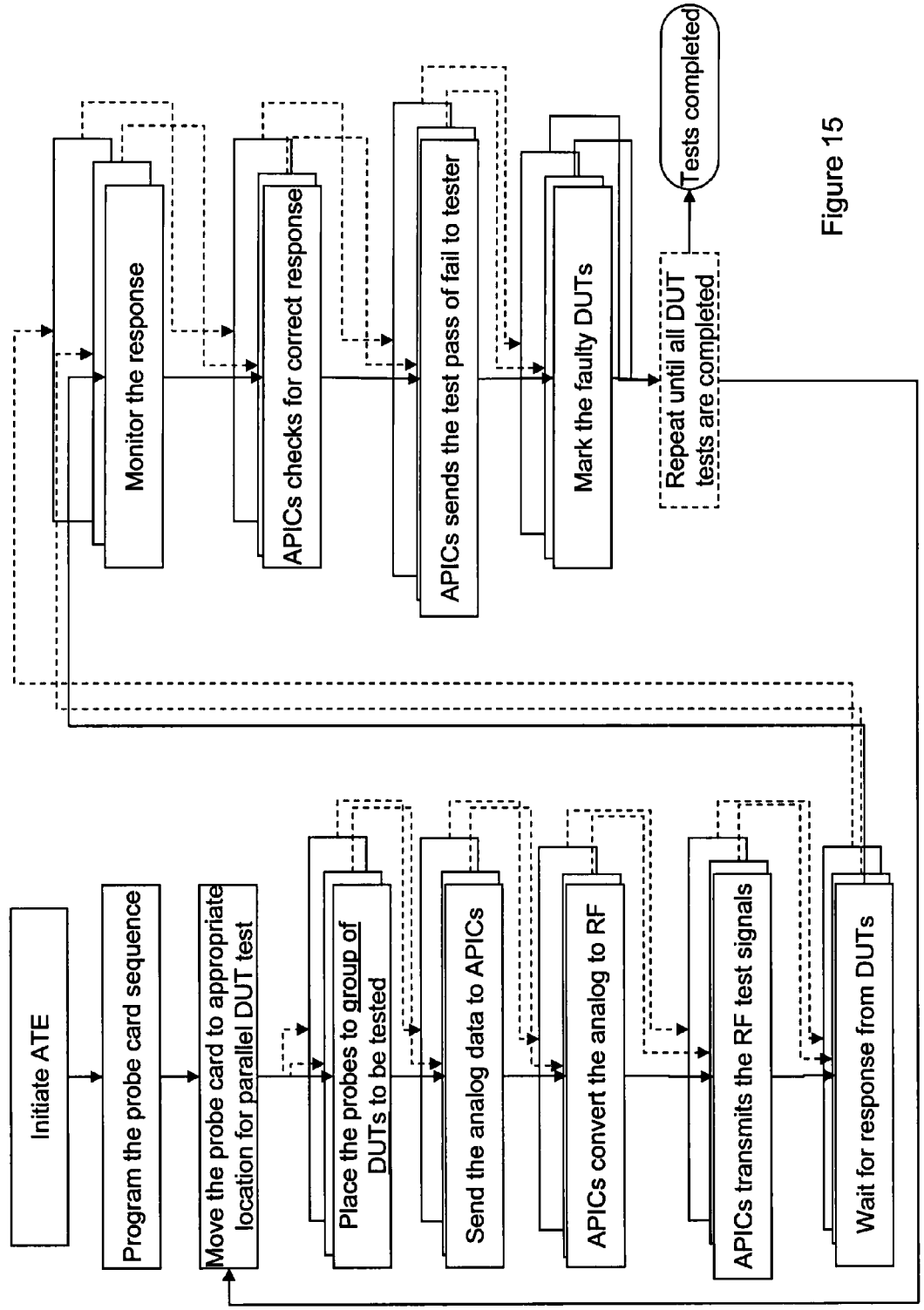
FIG. 15 shows a protocol for parallel testing of several DUT using active probes.

FIG. 14 shows one protocol for conventional sequential testing of several DUT 116 using active probes 202. FIG. 15 shows one protocol for simultaneous, parallel testing of several DUT 116 using a plurality of active probes 202.

Figure 16:
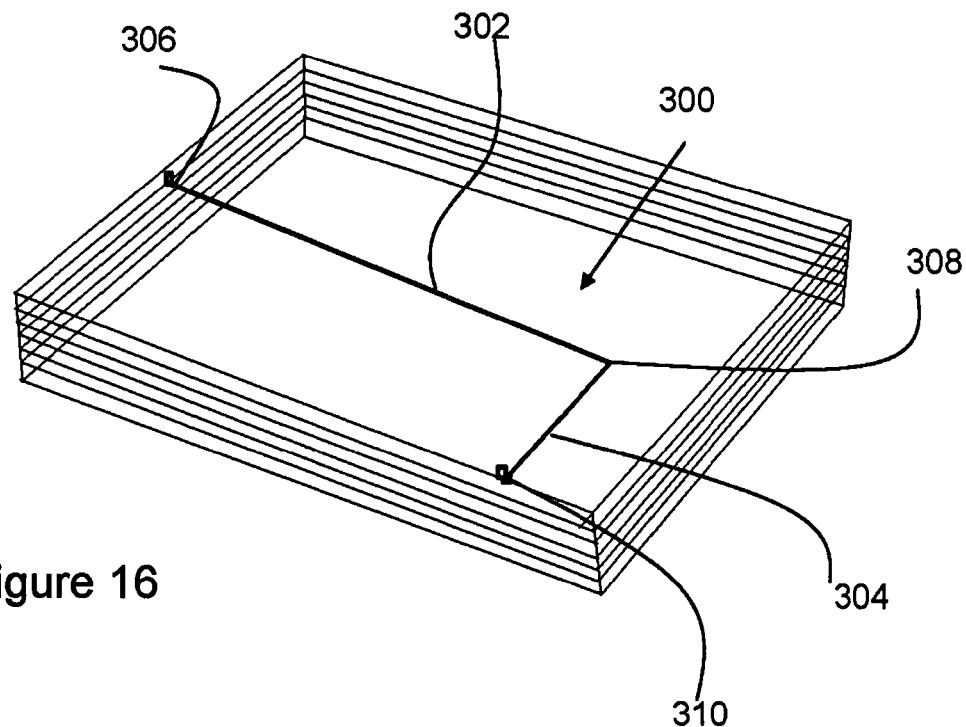
FIG. 16 shows a representative model of a single cantilever probe.
Figure 17:
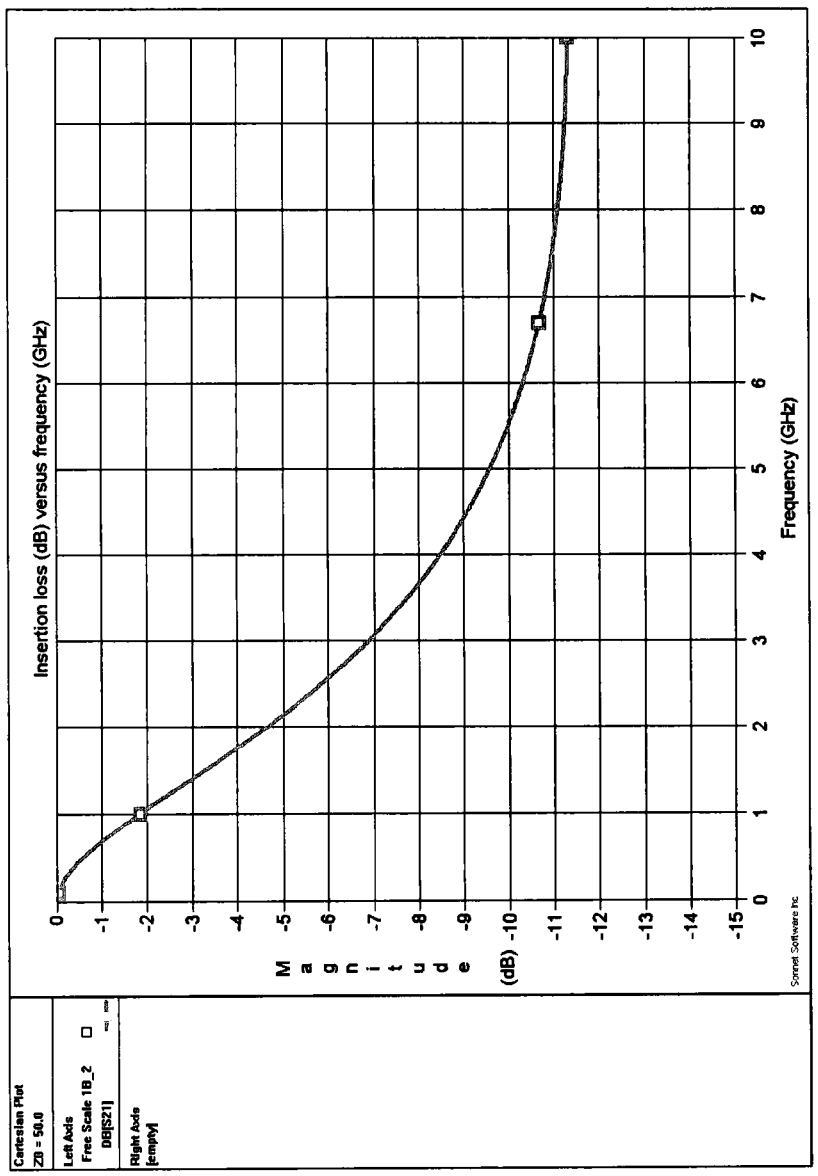
FIG. 17 shows a graph illustrating insertion loss (dB) vs. frequency (GHz) for a single cantilever probe.

Referring to FIG. 16, a single cantilever probe 300 is illustrated. Cantilever probe 300 typically comprises a supporting arm 302 and a contacting needle 304. Supporting arm 302 is attached at a base end 306 to the test unit structure. Contacting needle 304 is attached at a distal end 308 of supporting arm 302, and extends to a probe end 310 used to contact a DUT. This is the baseline case that represents the current means by which wafers are being tested using contact probes. FIG. 16 is a representative model of the probe structure, and not limiting. A single cantilever probe 300 has a characteristic impedance of 300Ω. It is typically driven by a source with source resistance 50Ω and terminated by a load with load resistance 50Ω which is the standard impedance used in industry to interface RF components. This matches the impedance of a coax line which has very good high frequency characteristics. A resistance of 50 ohms is also similar to that of a co-planar wave guide which also has good high frequency characteristics. Thus, impedance matching is an issue with testing high speed signals using standard test probe cards of the prior art. As well, slew and basic bandwidth can cause problems with current techniques. If a single probe 300 is used it has considerable signal loss at high frequencies and the characteristic impedance does not match the desired 50 ohms. This can be seen from FIG. 17 which illustrates a simulation of a single cantilever probe needle at high frequency with a mismatch of impedance at the source and load with respect to the probe needle.

Figure 18:
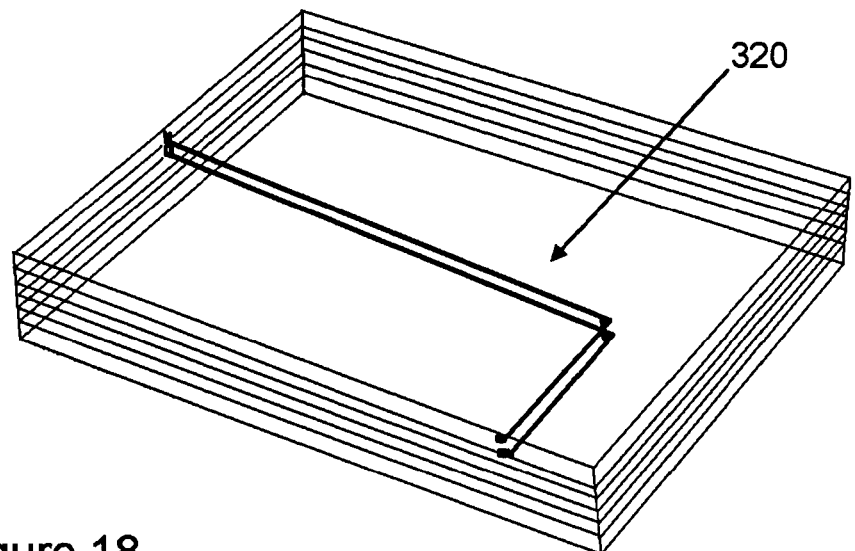
FIG. 18 shows a representative model of a balanced cantilever probe.
Figure 19:
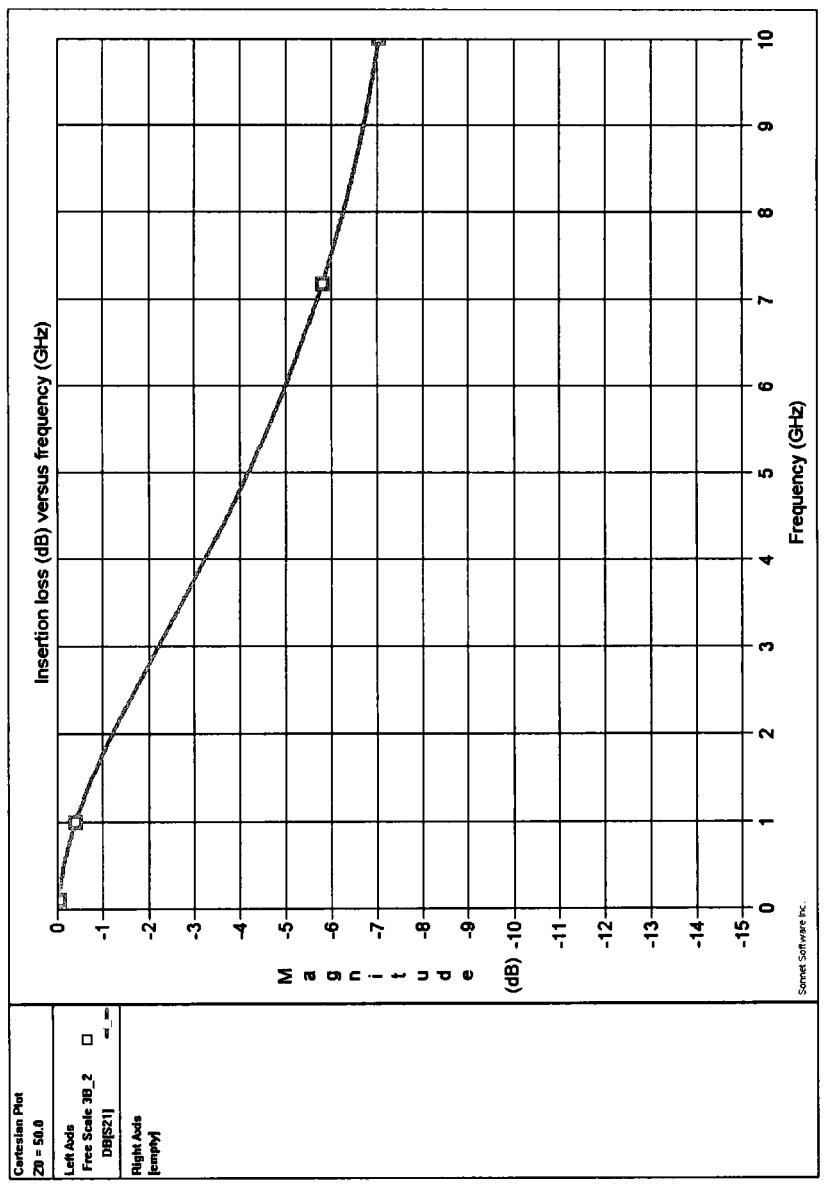
FIG. 19 shows a graph illustrating insertion loss (dB) vs. frequency (GHz) for a balanced cantilever probe.

Improvements can be made by including a ground return proximate to the signal probe as illustrated in FIG. 18. A "balanced cantilever" probe 320 is formed that can be modeled as a balanced transmission line, which delivers signal energy between wafer and a probe card. The characteristic impedance of balanced probe 320 is 200Ω. If it is driven by a source with source resistance 50Ω and terminated by a load with load resistance 50Ω, there is an improvement with respect to the single probe case as can be seen in the simulation shown in FIG. 19. The signal return probe proximate to the signal probe does not necessarily have to touch DUT 116, it may instead be connected by way of a small gap 324 or with a dielectric 326, as shown in FIG. 22.

Different types of probe needles can be used. For instance, improved performance at high frequencies can be realized by the use of vertical 328 or "cobra" type 330 probes, normally with a grounded guard 332, as illustrated in FIGS. 22a, 22b, 22c and 22d. Similarly, micromachined probe needles and membrane probe needles could be used to improve performance.

Figure 23B:
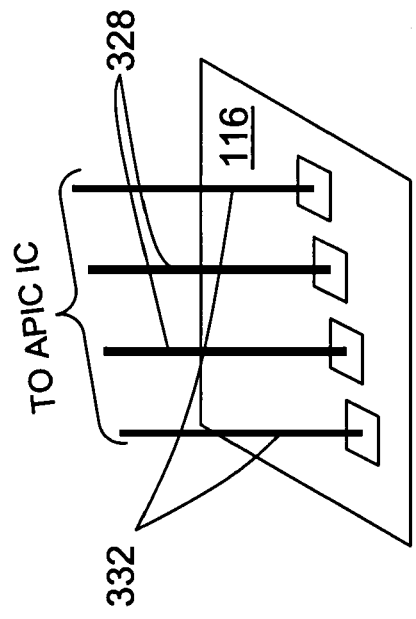
FIG. 23b shows a Ground-Signal-Signal-Ground configuration with vertical probes.
Figure 23A:
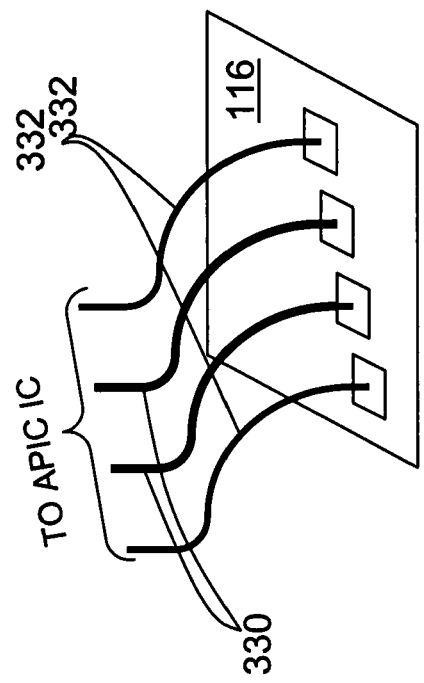
FIG. 23a shows a Ground-Signal-Signal-Ground configuration with cobra probes.

This approach also works for multiple probe situations such as balanced lines or 'double' probes as illustrated in FIG. 23.

Figure 20:
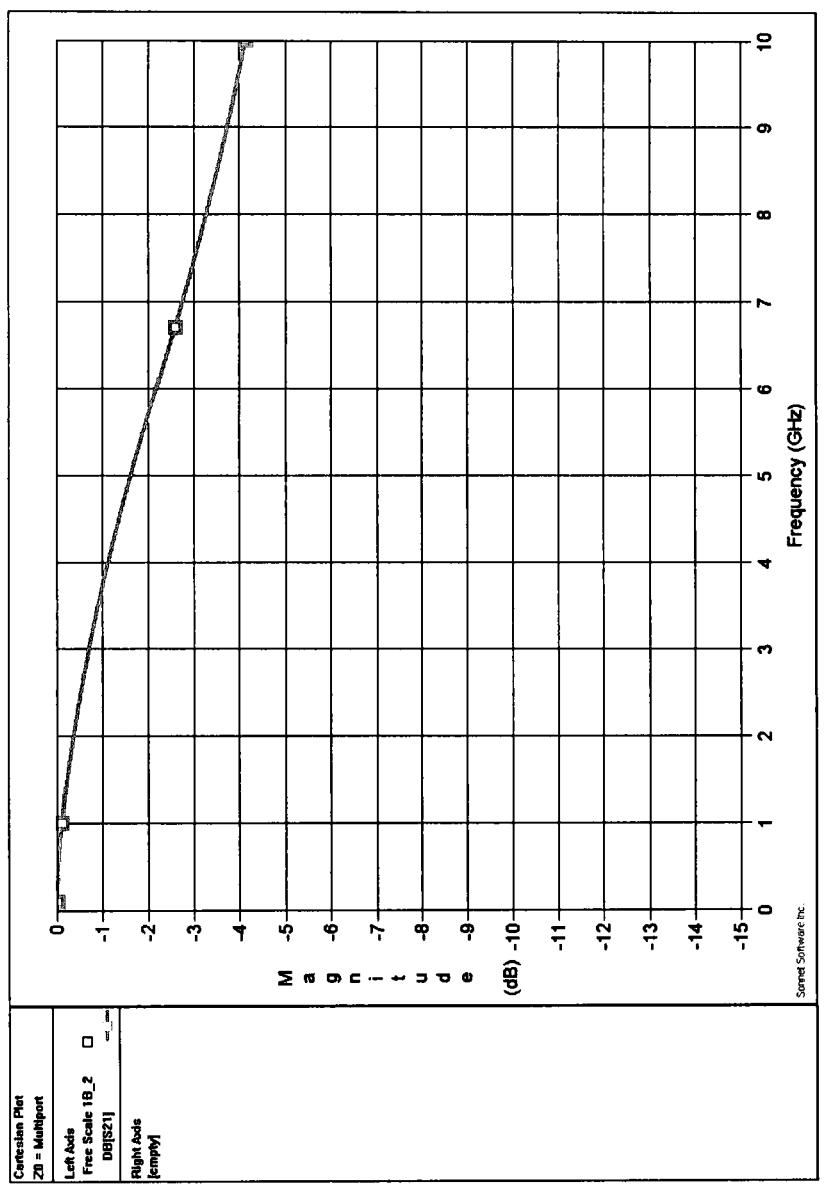
FIG. 20 shows a graph illustrating an improved insertion loss (dB) vs. frequency (GHz) for a single cantilever probe.

Referring to FIG. 20, a single cantilever probe was modeled and simulated with a characteristic impedance of 300Ω and driven by a source with source resistance 300Ω and terminated by a load with load resistance 300Ω. Note that the source and load resistances are equal to the characteristic impedance of the probe but that this is non-limiting. For instance, the source impedance could be 50Ω and the load impedance could be 300Ω. The latter case can be achieved where an APIC is designed to interface with a probe needle and the impedance of the APIC is matched to the impedance of the probe needle (in this case 300Ω). Referring to FIG. 20 it is observed that at 5 GHz there is an insertion loss improvement in using matched line to source and load is from −9 dB to −1.5 dB.

Figure 21:
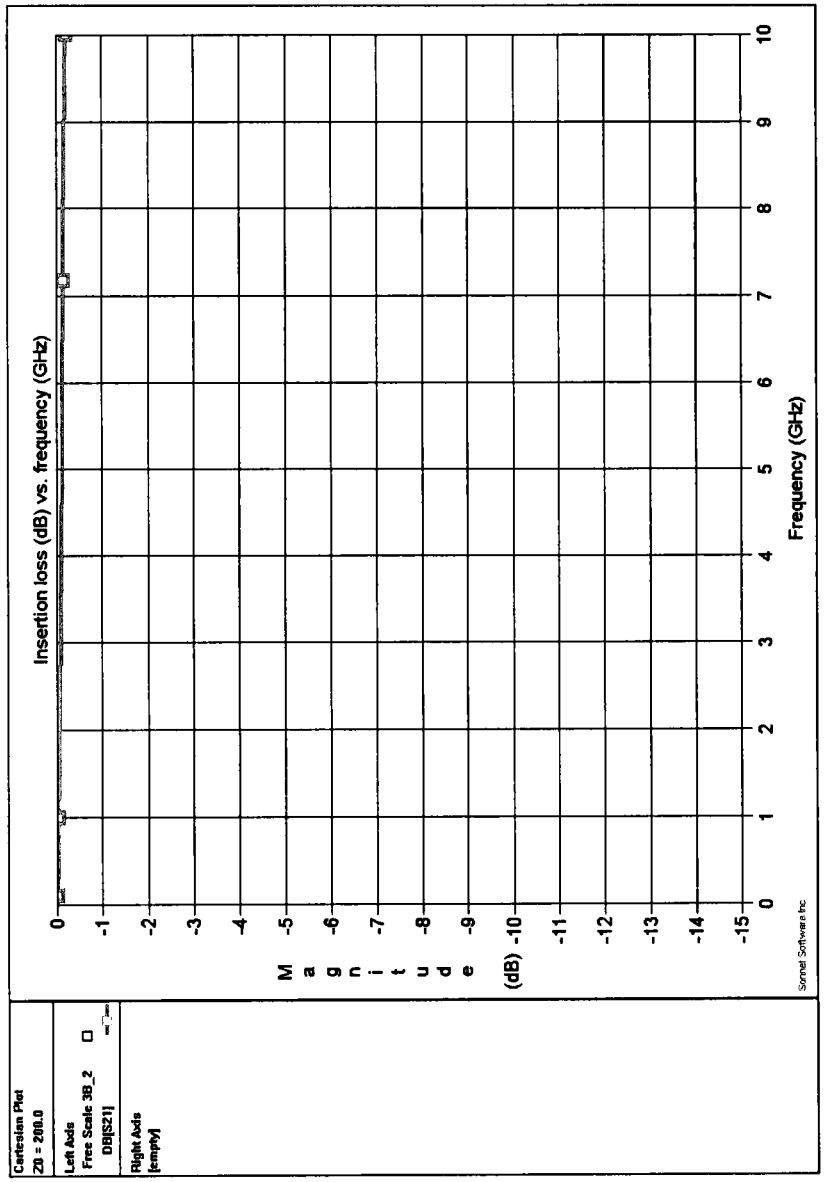
FIG. 21 shows a graph illustrating an improved insertion loss (dB) vs. frequency (GHz) for a balanced cantilever probe.

Similarly, the performance of a balanced cantilever probe may be improved. Referring to FIG. 21, a balanced cantilever probe was modeled and simulated with a characteristic impedance of 200 6, is driven by a voltage source with source resistance 200Ω and terminated by a load with load resistance 200Ω. Note that the source and load resistances are equal to the characteristic impedance of the probe but that this is non-limiting. For instance, the source impedance could be 50Ω and the load impedance could be 200Ω. The latter case can be achieved where an APIC is designed to interface with a probe needle and the impedance of the APIC is matched to the impedance of the probe needle (in this case 200Ω). Referring to FIG. 21, the insertion loss at 5 GHz is improved in using matched line to source and load is from −4 dB to −0.1 dB.

The combination of parallel operation of several tests and more rapid collection and reporting of data from testing DUT is a new massively parallel distributed test paradigm. In combination, the ability to perform multiple tests simultaneously using multiple probes 202 and associated multiple APIC 204, and the ability of APIC 204 to interpret the data from DUT 116 and transmit results from the tests to ATE 110 result in considerable time savings in testing each DUT 116.

A further advantage of the architectures illustrated in FIG. 5 is cost saving through amortization of develop and production costs over a larger number of chips 220 and consequent reduction of costs per test. A disadvantage of prior art systems, as illustrated in FIG. 1, is that they require design of a chip comprising substrate 104 and IC 106 specifically for testing each design of DUT 116. In contrast, because each probe 202 is in contact with a separate substrate 220, as illustrated in FIG. 5, the architecture of substrate 220 may be common for testing several different types of DUT 116. Test head 200 has a plurality of APIC 204, each of which is individually programmable, and each of which is programmed so that separate probes 202 conduct several parallel tests on DUT 116. Probes 202 on test head 200 necessarily have a spatial arrangement that enables contact with each of the required contact points 114 of DUT 116.

ADVANTAGES

Several advantages accrue from using the apparatus described above. Moving the RF or other measurement and sourcing circuitry to sites on the probe card very near the probes greatly simplifies the wafer test environment. Integrated RF components, for example, on silicon and SiGe circuits perform the necessary sourcing and measurement functions right on the probe card. With the active probe architecture only DC, digital and power signals need to be routed to the ATE system. This allows lower cost ATE configurations, simpler cabling and higher test parallelism, such as up to at least ×64 parallelism. The active probes can be used with many different traditional probe card technologies. Together, these features enable more rapid testing of DUT, up to at least ten-fold.

Since APIC devices are placed very close to the DUT the high speed/RF signals to and from the DUT can be converted to low speed/DC signals from and to the ATE. This enables the use of economical, low speed testers for high-speed and high frequency tests since the APIC can perform the high speed/RF data conversion and processing.

APICs placed on probe heads reduce noise and potential for channel interference. The APIC provides a configurable conversion of signals between the ATE and the DUT. Optionally, digital or analog channels are used between ATE and APIC devices instead of RF to eliminate signal degradation, fan out and noise interference. Optionally, major components of test data processing and analysis can be performed by the APIC, and so only a limited data signal needs to be communicated between the ATE and APIC, thus reducing the signal information content. This makes it possible to use slow speed testers and parallel connection of multiple APIC devices for parallel testing, a major cost advantage over single device test per touch down, and reduction in overall wafer test time. APICs convert the signals from ATE to a format that can be understood by the DUTs and vice versa. A further advantage accrues from using the APIC closer to the probe head tip so as to provide higher reliability than current solutions available in the market. Digital signals instead of analog can be used for more advanced versions of APIC for configurability, programmability and enhanced control of APIC devices for advanced solutions.

APICs may also be used to match impedances. For instance, an APIC may be specially designed to match the characteristic impedance of an RF probe need to the APIC. Such impedance matching can provide for significant improvement in insertion loss resulting in improved signal fidelity and integrity.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The following claims are to understood to include what is specifically illustrated and described above, what is conceptually equivalent, and what can be obviously substituted. Those skilled in the art will appreciate that various adaptations and modifications of the described embodiments can be configured without departing from the scope of the claims. The illustrated embodiments have been set forth only as examples and should not be taken as limiting the invention. It is to be understood that, within the scope of the following claims, the invention may be practiced other than as specifically illustrated and described.

What is claimed is:

1. A probe card comprising:
at least one reprogrammable active probe integrated circuit (APIC) positioned immediately adjacent and coupled to at least one probe array on a common substrate, the APIC being manufactured to test more than one device under test (DUT) with more than one different physical architecture, the at least one probe array being physically configurable to suit a DUT having a physical architecture capable of being tested by the APIC and the APIC being programmed to perform at least one desired signal transformation to suit the at least one probe array and the DUT, to provide power to the DUT, or to perform a desired signal transformation and provide power to the DUT.

2. The probe card of claim 1, wherein the probe array comprises one or more probes and is physically reconfigurable by repositioning one or more probes, actuating one or more probes or bending one or more probes.

3. The probe card of claim 1, wherein the APIC is integrally formed with at least one probe in the probe array.

4. The probe card of claim 1, further comprising at least one control signal channel, wherein, during operation:
the probe array transmits a test signal from the APIC to the DUT and transmits a test response signal from the DUT to the APIC; and
at least one control signal channel transmits a control signal from a test controller in parallel or in series to the APIC, and at least one control signal channel transmits a control response signal from the at least one APIC to the test controller;
the at least one APIC performing the desired signal transformation on at least one of the control signal and the control response signal.

5. The probe card of claim 4, wherein at least one of the control signal channels is one of a wireless channel, an electrical channel, an RF channel or a light channel.

6. The probe card of claim 1, wherein the probe array is reconfigurable by bending one or more probes, by actuating one or more probes or by removing and repositioning one or more probes.

7. The probe card of claim 1, wherein the probe array comprises one or more probes.

8. The probe card of claim 7, wherein each probe is one of a cantilever probe, vertical probe, cobra probe, solder ball, microspring, a MEMS probe, a non-contact probe and a resilient contact.

9. The probe card of claim 1, comprising more than one APIC, wherein each APIC is programmed to conduct at least one specific test on the DUT.

10. The probe card of claim 1, wherein the APIC is positioned at a proximate end of the associated probe, a distal end of the associated probe or at a position between the proximate end and the distal end of the associated probe.

11. The probe card of claim 1, wherein at least one APIC is coupled with a probe in a one to one relationship.

12. The probe card of claim 1, comprising more than one APIC coupled to one of the at least one probe array.

13. A probe card comprising:
at least one probe of claim 1; and
at least one control signal channel for transmitting a control signal from a test controller to the APIC, wherein, in operation:
the probe transmits a test signal from the APIC to the DUT and transmits a test response signal from the DUT to the APIC;
at least one control signal channel transmits a control signal from a test controller in parallel or in series to at least one APIC, and at least one control signal channel transmits a control response signal from the at least one APIC to the test controller; and
the at least one APIC performing the desired signal transformation on at least one of the control signal and the control response signal.

14. The probe card of claim 13, wherein the at least one probe comprises a probe array, and wherein the probe array is reconfigurable by bending one or more probes, by actuating one or more probes or by removing and repositioning one or more probes.

15. A method of forming a probe card, the method comprising the steps of:
characterizing a device under test (DUT) having a physical architecture;
physically configuring a probe array based on the characterization of the characterized DUT;
coupling at least one programmable active probe integrated circuit (APIC) to the physically configured probe array, the APIC being manufactured to test the characterized DUT and at least one DUT having a physical architecture that is different than the characterized DUT;
reprogramming the at least one APIC to perform a desired signal transformation, to provide power to the DUT, or to perform a desired signal transformation and provide power to the DUT based on the characterization of the DUT.

16. The method of claim 15, further comprising the step of integrally forming at least one APIC with or placing at least one APIC immediately adjacent to a probe in the probe array.

17. The method of claim 15, further comprising the steps of:
providing at least one control signal channel;
transmitting a control signal through at least one control signal channel from a test controller in parallel or in series to the APIC;
transmitting a test signal through at least one probe in the probe array from the APIC to the DUT in response to the control signal;
transmitting a test response signal through at least one probe in the probe array from the DUT to the APIC in response to the test signal;
transmitting a control response signal through at least one control signal channel from the APIC to the test controller; and
the at least one APIC performing the desired signal ansformation on at least one of the control signal and the control response signal.

18. The method of claim 17, wherein transmitting at least one of the test signal and the test response signal comprises transmitting a signal selected from a group consisting of: RF signals, analog signals, digital signals, the control signal and the control response signal are signals having a frequency below RF signal.

19. The method of claim 15, wherein reconfiguring the probe array comprises bending one or more probes or removing and repositioning one or more probes.

20. The method of claim 15, wherein at least one APIC is coupled with a probe in a one to one relationship.

21. The method of claim 15, comprising more than one APIC coupled to one of the at least one probe array.

* * * * *